(12) United States Patent
Erlich et al.

(10) Patent No.: US 9,482,863 B2
(45) Date of Patent: Nov. 1, 2016

(54) PRODUCTION OF MICRO-MECHANICAL DEVICES

(71) Applicant: PRIMESENSE LTD., Tel Aviv (IL)

(72) Inventors: Raviv Erlich, Rehovot (IL); Yuval Gerson, Tel-Mond (IL); Alexander Shpunt, Tel Aviv (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/350,580

(22) PCT Filed: Oct. 22, 2013

(86) PCT No.: PCT/IB2013/059531
§ 371 (c)(1),
(2) Date: Apr. 9, 2014

(87) PCT Pub. No.: WO2014/064606
PCT Pub. Date: May 1, 2014

(65) Prior Publication Data
US 2015/0338643 A1    Nov. 26, 2015

Related U.S. Application Data

(60) Provisional application No. 61/717,427, filed on Oct. 23, 2012.

(51) Int. Cl.
*B81C 1/00* (2006.01)
*G02B 26/08* (2006.01)
*G02B 26/10* (2006.01)

(52) U.S. Cl.
CPC ....... *G02B 26/0833* (2013.01); *B81C 1/00484* (2013.01); *B81C 1/00904* (2013.01); *G02B 26/085* (2013.01); *G02B 26/101* (2013.01); *B81B 2201/042* (2013.01); *B81B 2203/0109* (2013.01); *H01L 2924/0002* (2013.01)

(58) Field of Classification Search
None
See application file for complete search history.

(56) References Cited

U.S. PATENT DOCUMENTS 3,918,068 A    11/1975   Reinke et al.
4,003,626 A    1/1977    Reinke et al.
5,742,419 A    4/1998    Dickensheets et al.
(Continued)

FOREIGN PATENT DOCUMENTS

EP    2333603 A1    6/2011
EP    1719012 B1    3/2012
(Continued)

OTHER PUBLICATIONS

European Application # 10192429-8 Search Report dated Jul. 13, 2015.
(Continued)

*Primary Examiner* — Charles Garber
*Assistant Examiner* — Brigitte Paterson
(74) *Attorney, Agent, or Firm* — D. Kligler IP Services Ltd.

(57) ABSTRACT

A method for fabrication of a device (206) from a wafer (170) of semiconductor material includes locally thinning the wafer in an area of the device to a predefined thickness by removing the semiconductor material from at least a first side of the wafer using a wet etching process, and etching through the thinned wafer in the area of the device so as to release a moving part (202) of the device. Other methods and systems for fabrication are also described.

11 Claims, 16 Drawing Sheets

(56) References Cited

U.S. PATENT DOCUMENTS

| | | | |
|---|---|---|---|
| 5,938,989 A | 8/1999 | Hambright | |
| 6,044,705 A | 4/2000 | Neukermans et al. | |
| 6,140,979 A | 10/2000 | Gerhard et al. | |
| 6,517,751 B1 | 2/2003 | Hambright | |
| 6,714,336 B2 | 3/2004 | Orcutt et al. | |
| 6,924,915 B2 | 8/2005 | Hirose et al. | |
| 7,295,726 B1* | 11/2007 | Milanovic | G02B 26/0841 385/14 |
| 7,833,430 B2* | 11/2010 | Mi | B81C 1/00547 216/58 |
| 7,952,781 B2 | 5/2011 | Weiss et al. | |
| 8,018,579 B1 | 9/2011 | Krah | |
| 8,437,063 B2 | 5/2013 | Weiss et al. | |
| 2002/0071169 A1* | 6/2002 | Bowers | B81B 3/004 359/291 |
| 2003/0162313 A1 | 8/2003 | Kim et al. | |
| 2004/0004775 A1 | 1/2004 | Turner | |
| 2004/0040648 A1 | 3/2004 | Harden et al. | |
| 2004/0063235 A1 | 4/2004 | Chang | |
| 2004/0070816 A1* | 4/2004 | Kato | G02B 26/085 359/291 |
| 2004/0207744 A1 | 10/2004 | Bock | |
| 2004/0214350 A1* | 10/2004 | Pan | G02B 26/0841 438/1 |
| 2005/0157375 A1 | 7/2005 | Doan et al. | |
| 2008/0143196 A1 | 6/2008 | Sprague et al. | |
| 2008/0225368 A1 | 9/2008 | Ciabattoni et al. | |
| 2009/0042366 A1 | 2/2009 | Grivna | |
| 2009/0284817 A1 | 11/2009 | Orcutt | |
| 2010/0046054 A1 | 2/2010 | Jeong et al. | |
| 2010/0302617 A1 | 12/2010 | Zhou | |
| 2011/0188054 A1 | 8/2011 | Petronius et al. | |
| 2011/0228367 A1 | 9/2011 | Lubianiker et al. | |
| 2011/0277813 A1* | 11/2011 | Rogers | H01L 31/035281 136/244 |
| 2011/0279648 A1 | 11/2011 | Lutian et al. | |
| 2011/0310125 A1 | 12/2011 | McEldowney et al. | |
| 2011/0310452 A1 | 12/2011 | Lin | |
| 2012/0236379 A1 | 9/2012 | Dasilva et al. | |
| 2012/0286378 A1* | 11/2012 | Lee | H02N 1/008 257/415 |
| 2013/0206967 A1 | 8/2013 | Shpunt et al. | |
| 2013/0207970 A1 | 8/2013 | Shpunt et al. | |
| 2014/0153001 A1 | 6/2014 | Chayat et al. | |
| 2014/0291491 A1 | 10/2014 | Shpunt et al. | |
| 2014/0291496 A1 | 10/2014 | Shpunt et al. | |
| 2014/0310914 A1 | 10/2014 | Erlich et al. | |

FOREIGN PATENT DOCUMENTS

| | | |
|---|---|---|
| GB | 2271436 A | 4/1994 |
| JP | 2004191918 A | 7/2004 |
| WO | 0212925 A2 | 2/2002 |
| WO | 0247241 A1 | 6/2002 |
| WO | 03012491 A2 | 2/2003 |
| WO | 03/049156 A2 | 6/2003 |
| WO | 2004000720 A1 | 12/2003 |
| WO | 2012/020380 A1 | 2/2012 |
| WO | 2014016794 A1 | 1/2014 |

OTHER PUBLICATIONS

U.S. Appl. No. 14/298,925 Office Action dated Oct. 6, 2015.
AU Application # 2015100178 Office Action dated Apr. 17, 2015.
Judy et al., "Magnetic Microactuation of Polysilicon Flexure Structures," Solid-State Sensor and Actuator Workshop, year 1994.
Judy et al., "Magnetically Actuated, Addressable Microstructures," Journal of Microelectromechanical Systems, vol. 6, No. 3, pp. 249-256, Sep. 1997.
Cho et al., "A Scanning Micromirror Using a Bi-Directionally Movable Magnetic Microactuator," Proceedings of SPIE, MOEMS and Miniaturized Systems, vol. 4178, pp. 106-115, USA 2000.
Hamamatsu Photonics K.K., "Position sensitive detectors", Japan, Feb. 2010.
Gale, M.T., "Replication Technology for Diffractive Optical Elements", Proceedings of SPIE, vol. 3010, pp. 111-123, May 15, 1997.
Kolste et al., "Injection Molding for Diffractive Optics", Proceedings of SPIE, vol. 2404, pp. 129-131, Feb. 9, 1995.
Gale et al., "Replicated Microstructures for Integrated Topics", Proceedings of SPIE, vol. 2513, pp. 2-10, Aug. 29, 1994.
Jahns et al., "Diffractive Optics and Micro-Optics: Introduction to the Feature Issue", Applied Optics Journal, vol. 36, No. 20, pp. 4633-4634, Jul. 10, 1997.
Nikolejeff et al., "Replication of Continuous Relief Diffractive Optical Elements by Conventional Compact Disc Injection-Molding Techniques", Applied Optics Journal, vol. 36, No. 20, pp. 4655-4659, Jul. 10, 1997.
Neyer et al., "New Fabrication Technology for Polymer Optical Waveguides", Integrated Photonics Research, pp. 248-249, year 1992.
Neyer et al., "Fabrication of Low Loss Polymer Waveguides Using Injection Moulding Technology", Electronics Letters, vol. 29, No. 4, pp. 399-401, Feb. 18, 1993.
Optical Society of America, "Diffractive Optics and Micro-Optics", 1996 Technical Digest Series, vol. 5, Boston, USA, Apr. 29-May 2, 1996.
Lintec Corporation, "Adwill D-510T Tape", Japan, Apr. 4, 2006.
Stark, B., "MEMS Reliability Assurance Guidelines for Space Applications", Jet Propulsion Laboratory, California Institute of Technology, Pasadena, USA, Jan. 1999.
International Application PCT/IL2005/001194 Search Report dated Jun. 6, 2006.
Mor et al., U.S. Appl. No. 12/723,644, filed Mar. 14, 2010.
International Application PCT/IB2013/051985 Search Report dated Jul. 22, 2013.
Fujita et al., "Dual-Axis MEMS Mirror for Large Deflection-Angle Using SU-8 Soft Torsion Beam," Sensors and Actuators A: Physical, vol. 121, issue 1, pp. 16-21, May 2005.
Stone et al., "Performance Analysis of Next-Generation LADAR for Manufacturing, Construction, and Mobility", National Institute of Standards and Technology, document # NISTIR 7117, Gaithersburg, USA, May 2004.
European Patent Application # 12155674.0 Search Report dated May 3, 2013.
International Patent Application # PCT/IB2013/056101 Search Report dated Dec. 17, 2013.
International Application PCT/IB2013/051189 Search Report dated Jun. 18, 2013.
International Application PCT/IB2013/059531 Search Report dated Mar. 25, 2014.
Pal et al., "A Novel Process for Perfect Convex Corner Realization in Bulk Micromachining", Journal of Micromechanics and Microengineering, vol. 14, No. 10, pp. 1416-1420, Jul. 23, 2004.

* cited by examiner

PRODUCTION OF MICRO-MECHANICAL DEVICES

CROSS-REFERENCE TO RELATED APPLICATIONS

This application claims the benefit of U.S. Provisional Patent Application 61/717,427, filed Oct. 23, 2012, which is incorporated herein by reference.

FIELD OF THE INVENTION

The present invention relates generally to production of semiconductor devices, and particularly to processes used in producing micro-mechanical devices.

BACKGROUND

Various techniques have been developed for producing micro-mechanical devices from semiconductor wafers. These techniques make use of equipment and methods that have been developed for microelectronics manufacturing, such as thin-film deposition and photolithography, in order to create moving mechanical devices on micrometer scales.

For example, U.S. Pat. No. 7,952,781, whose disclosure is incorporated herein by reference, describes a method of scanning a light beam and a method of manufacturing a microelectromechanical system (MEMS), which can be incorporated in a scanning device. The disclosed method of manufacturing uses a silicon-on-insulator (SOI) wafer, which typically comprises a silicon layer on its front side, another silicon layer on its back side, and a thin "stop" layer therebetween. The steps of the method include thinning of the silicon, deposition of silicon dioxide (SiO2), lithography, etching, and metal deposition. Two etching processes are employed: reactive ion etching (RIE) and dry reactive ion etching (DRIE, also known as deep reactive ion etching) to expose the "stop" layer. The substrate then is separated into chips and subjected to a cleaning process, whereupon a rotatable micromirror is formed.

SUMMARY

Embodiments of the present invention that are described hereinbelow provide novel methods for production of micro-mechanical devices from semiconductor wafers, as well as devices produced according to such methods and systems for implementing the methods.

A method for fabrication of a device from a wafer of semiconductor material having first and second sides. The method includes locally thinning the wafer in an area of the device to a predefined thickness by removing the semiconductor material from at least the first side of the wafer using a wet etching process. The thinned wafer is etched through in the area of the device so as to release a moving part of the device.

In some embodiments, the method includes etching, using a dry etching process, a pattern of features of the device into the semiconductor material on the first side of the wafer, typically before locally thinning the wafer. In one embodiment, etching the pattern includes depositing a dielectric layer on at least the first side of the wafer, etching the pattern of features of the device through the dielectric layer into the semiconductor material, and after etching the pattern, removing the dielectric layer from at least the area of the device. Depositing the dielectric layer may include depositing first and second dielectric layers, respectively, on the first and second sides of the wafer, wherein the first dielectric layer is removed from the wafer before thinning the wafer, and the second dielectric layer is removed from the wafer only after thinning the wafer.

Alternatively or additionally, removing the dielectric layer includes leaving the dielectric layer in place around a perimeter of the device so as to prevent thinning of the perimeter during the wet etching process. In this case, depositing the dielectric layer may include depositing a first dielectric layer over the first side of the wafer, etching away the first dielectric layer from the area of the wafer that is to contain the pattern, so as to expose the semiconductor material in the area while the first dielectric layer remains in place around the perimeter of the device, and depositing a second dielectric layer over the exposed semiconductor material and over the remaining first dielectric material, wherein the pattern is etched into the semiconductor material through the second dielectric layer.

In a disclosed embodiment, the semiconductor material is silicon, and the dielectric layer includes a first sub-layer of silicon dioxide and a second sub-layer of silicon nitride adjacent to the first sub-layer.

In one embodiment, thinning the wafer includes removing the semiconductor material from both the first and second sides of the wafer using the wet etching process.

The method may include depositing a reflective layer on the second side of the wafer after thinning the wafer, whereby the device is configured to serve as a scanning mirror.

In some embodiments, etching through the thinned wafer includes depositing a photoresist on the second side of the wafer, and applying a photolithographic process to define and etch openings passing through the thinned wafer. Typically, the openings include release openings, whereby the moving part of the device is separated along the release openings from a remaining portion of the device. Additionally or alternatively, the openings include singulation openings around an area of the device, and the method includes separating the device from a remaining portion of the wafer along the singulation openings. Applying the photolithographic process may include etching the singulation openings so as to leave tabs extending across the singulation openings between the device and the remaining portion of the wafer, wherein separating the device includes breaking the tabs.

There is also provided, in accordance with an embodiment of the present invention, a method for fabrication of a device, which includes providing first and second wafers of semiconductor material, both wafers having respective first and second sides, the first wafer having multiple cavities that open through the first side thereof. A dielectric layer is formed on the first side of at least one of the first and second wafers. The first and second wafers are joined together by bonding the first side of the first wafer to the first side of the second wafer along the dielectric layer. While the first and second wafers are joined together, the second wafer is processed to form features of the device. After processing the second wafer, the first wafer and the dielectric layer are removed from the second wafer by applying an etchant through the cavities to the dielectric layer.

Typically, processing the second wafer includes thinning the second wafer. Processing the second wafer may also include etching a pattern of the features of the device into the second wafer.

After removing the first wafer, the first wafer may be reused by joining the first wafer to one or more further wafers for processing of the further wafers.

In a disclosed embodiment, the cavities in the first wafer define first and second protrusions between the cavities on the first side of the first wafer, the protrusions having different, respective first and second sizes, wherein the first and second sizes are chosen so that applying the etchant removes the dielectric layer from the first protrusions while the second protrusions remain bonded to the second wafer. Typically, processing the second wafer includes forming the features of the device in an area of the second wafer that is in contact with the first protrusions, and etching singulation openings through the second wafer around the area, and the method includes separating the device from a remaining portion of the wafer along the singulation openings while the remaining portion of the wafer remains bonded to the second protrusions.

In some embodiments, etching the singulation openings includes leaving tabs, following the etching, that extend across the singulation openings between the device and the remaining portion of the wafer, and wherein separating the device includes breaking the tabs.

Typically, providing the first wafer includes patterning and etching the cavities from the first side of the first wafer into the first wafer. In a disclosed embodiment, the semiconductor material includes silicon, and the dielectric material includes silicon dioxide, and the etchant includes hydrofluoric acid.

In one embodiment, the method includes, after etching the pattern but before removing the first wafer and the dielectric layer, mounting the second side of the second wafer on a support structure, whereby the second wafer is supported by the support structure after removal of the first wafer and the dielectric layer. The method may then include, after mounting the second side of the second wafer on the support structure, etching through the second wafer around the features so as to release the device from the support structure.

There is additionally provided, in accordance with an embodiment of the present invention, a method for fabrication of a device, which includes bonding a first side of a wafer of semiconductor material, having first and second sides, to a support substrate using an adhesive. While the wafer is bonded to the support substrate, release openings are etched through the wafer to the support substrate around an area of the device. After etching the release openings, the adhesive is debonded so as to release a moving part of the device.

The method may include, while the wafer is bonded to the support substrate, etching a pattern of features of the device into the second side of the wafer.

Additionally or alternatively, the method may include, while the wafer is bonded to the support substrate, etching singulation openings through the wafer around the release openings, and separating the device from a remaining portion of the wafer along the singulation openings while the remaining portion of the wafer remains bonded to the support substrate.

Typically, the method includes thinning the wafer while the wafer is bonded to the support substrate.

In a disclosed embodiment, the support substrate is transparent to optical radiation, and debonding the adhesive includes irradiating the adhesive with the optical radiation, such as ultraviolet radiation, through the support substrate.

Alternatively, debonding the adhesive includes heating the adhesive through the support substrate.

There is further provided, in accordance with an embodiment of the present invention, a method for fabrication of a device using a first semiconductor wafer having first and second sides. The method includes providing a second semiconductor wafer having a cavity therein. The first side of the first semiconductor wafer is bonded to the second semiconductor wafer so that the cavity is positioned over an area of the device in the first semiconductor wafer. While the first side of the first semiconductor wafer is bonded to the second semiconductor wafer, the second side of the first semiconductor wafer is thinned to a predefined thickness. Release openings are etched into the first semiconductor wafer, such that the release openings pass through the first semiconductor wafer after the thinning, so as to release a moving part of the device. The device is then from the second semiconductor wafer.

In some embodiments, separating the device includes etching singulation openings through the first semiconductor wafer around the release openings while the first side of the first semiconductor wafer is bonded to the second semiconductor wafer, and separating the device along the singulation openings from a remainder of the first semiconductor wafer, which remains bonded to the second semiconductor wafer.

In some embodiments, etching the release openings includes forming the release openings in the first side of the first semiconductor wafer before bonding the first side of the first semiconductor wafer to the second semiconductor wafer. In one embodiment, a pattern of the device is etched to a first depth, and the release openings are etched to a second depth, which is greater than the first depth but less than a thickness of the first semiconductor wafer prior to the thinning.

Alternatively, etching the release openings includes forming the release openings through the second side of the first semiconductor wafer after bonding the first side of the first semiconductor wafer to the second semiconductor wafer and thinning the second side of the first semiconductor wafer.

In a disclosed embodiment, the cavity is formed in a proximal side of the second semiconductor wafer to a depth such that a distal side of the cavity, opposite the proximal side, remains closed, wherein the first side of the first semiconductor wafer is then bonded to the proximal side of the second semiconductor wafer.

Alternatively, providing the second semiconductor wafer includes applying a wet etching process to both proximal and distal sides of the second semiconductor wafer in order to form the cavity.

In one embodiment, the method includes, before bonding the first side of the first semiconductor wafer to the second semiconductor wafer, etching, into the first side of the first semiconductor wafer, a pattern of features of the device.

There is moreover provided, in accordance with an embodiment of the present invention, a system for fabrication of a device from a wafer of semiconductor material having first and second sides. The system includes a thinning station, configured to locally thin the wafer in an area of the device to a predefined thickness by removing the semiconductor material from at least the first side of the wafer using a wet etching process. At least one etching station is configured to etch through the thinned wafer in the area of the device so as to release a moving part of the device.

There is furthermore provided, in accordance with an embodiment of the present invention, a system for fabrication of a device, including a deposition station, which is configured to form a dielectric layer on the first side of at least one of a first wafer and a second wafer of semiconductor material, both wafers having respective first and second sides, the first wafer having multiple cavities that open through the first side thereof. A bonding station is configured to join the first and second wafers together by bonding the first side of the first wafer to the first side of the second wafer along the dielectric layer. At least a first etching station is configured to process the second wafer while the first and second wafers are joined together to form features of the device. A second etching station is configured, after forming the features in the second wafer, to remove the first wafer and the dielectric layer from the second wafer by applying an etchant through the cavities to the dielectric layer.

There is also provided, in accordance with an embodiment of the present invention, a system for fabrication of a device, including a bonding station, which is configured to bond a first side of a wafer of semiconductor material, having first and second sides, to a support substrate using an adhesive. At least one etching station is configured to etch release openings through the wafer to the support substrate around an area of the device while the wafer is bonded to the support substrate. A debonding station is configured to debond the adhesive after etching of the release openings so as to release a moving part of the device.

There is additionally provided, in accordance with an embodiment of the present invention, a system for fabrication of a device, including a bonding station, which is configured to bond a first side of a first semiconductor wafer to a second semiconductor wafer having a cavity therein so that the cavity is positioned over an area of the first semiconductor wafer that contains the pattern. A thinning station is configured to thin a second side of the first semiconductor wafer to a predefined thickness while the first side of the first semiconductor wafer is bonded to the second semiconductor wafer. At least one etching station is configured to etch release openings into the first semiconductor wafer in an area of the device in the first semiconductor wafer, such that the release openings pass through the first semiconductor wafer after the thinning, so as to release a moving part of the device.

The present invention will be more fully understood from the following detailed description of the embodiments thereof, taken together with the drawings in which:

DETAILED DESCRIPTION OF EMBODIMENTS

Overview

Figure 1:
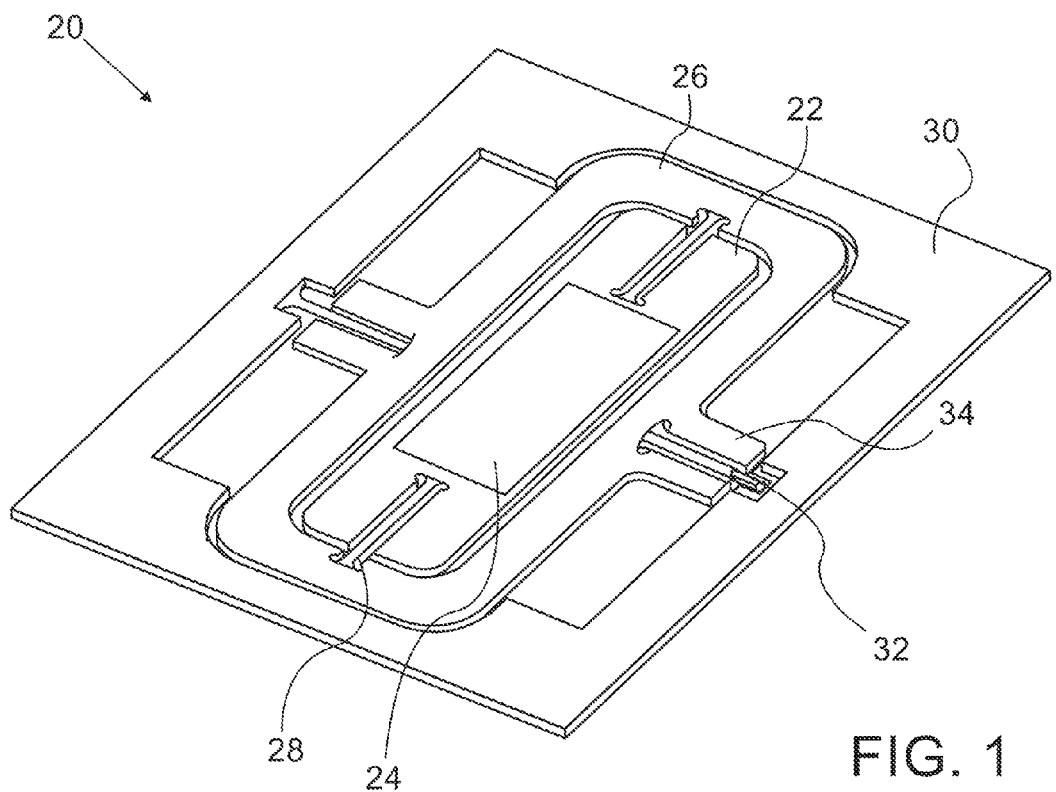
FIG. 1 is schematic, pictorial illustration of a MEMS gimbaled mirror device, produced in accordance with an embodiment of the present invention.

Micro-mechanical devices that are produced from semiconductor wafers, such as MEMS devices, often require a large range of movement. For this purpose, the moving part is typically made thin, and therefore may not be stable when produced on a wafer scale. To deal with this instability, a thick support layer is often needed, in addition to the device layer from which the actual device is made, in order to provide additional mechanical strength during production. The support layer is commonly joined to the device layer in a silicon-on-insulator (SOI) configuration, with a dielectric (oxide) layer bonded in between, as in the above-mentioned U.S. Pat. No. 7,952,781, for example.

Production of MEMS devices from SOI using processes that are known in the art generally requires that large amounts of semiconductor material be removed from the device and support wafers, typically by DRIE and wafer thinning processes. These processes are time-consuming and thus expensive. Moreover, uniformity of these processes over the entire wafer scale can be difficult to maintain, further complicating device production and reducing yield.

Embodiments of the present invention that are described hereinbelow provide novel methods and systems for wafer-scale production of micro-mechanical devices that can enhance process efficiency and yield. The example embodiments described below refer specifically, for the sake of clarity and concreteness, to production of MEMS-based scanning mirrors from silicon wafers. The principles of the present invention, however, are similarly applicable to other types of silicon MEMS devices and, mutatis mutandis, micro-mechanical devices of other types that can be made from semiconductor wafers. Although the figures illustrating each of the embodiments show, for the sake of simplicity, stages in the production of a single device, in practice the disclosed techniques are applied to a large matrix of dies simultaneously and thus reliably produce large numbers of replicated devices from each wafer.

In some embodiments, a wet etching process is used to locally thin the wafer in an area of the device to a predefined thickness, by removing the semiconductor material from at least the one side of the wafer (and possibly both). A further etching process, typically dry etching, such as RIE and/or DRIE, is applied to etch through the thinned wafer in the area of the device so as to release the moving part or parts of the device. The term "release" in this context means that these parts are free to move as intended in the device design, although they may typically remain attached to other parts of the device by hinges or other connections.

Optionally, singulation openings may also be etched through the thinned wafer around the area of the device, and the device is then separate from the remaining portion of the wafer along the singulation openings. The singulation openings may be etched in such a way as to leave tabs extending across the singulation openings between the device and the remaining portion of the wafer, to hold the device in place temporarily. The tabs are then broken in order to singulate the device.

In some embodiments, a dielectric layer (such as a silicon dioxide layer) is deposited on one or both sides of the semiconductor wafer and is lithographically patterned to define a pattern of features of the device before thinning. A wet etching process is applied in order to etch the pattern of features through the patterned dielectric layer into the semiconductor material. After etching the pattern, the dielectric layer is removed from at least the area of the wafer that contains the pattern (although the dielectric layer is generally left in place around the perimeter of this area). The wafer is then thinned to the appropriate thickness using the wet etching process, which removes the semiconductor material from at least the patterned side of the wafer, and possibly from both sides. This sort of wet etching has the advantage of preserving the etched pattern, while reducing the wafer thickness quickly, uniformly, and inexpensively, and leaving the surface smooth at the end of the process. After thinning, an additional etching step may be applied to etch through the wafer around the etched pattern for purposes of creating the release and singulation grooves.

The embodiment described above operates on a simple, single silicon wafer, rather than an SOI wafer, as is commonly used in MEMS production. On the other hand, an alternative embodiment of the present invention provides a novel support wafer and a technique for quick, efficient removal of the support wafer after use. For this purpose, the support wafer has multiple cavities that open through at least a first side, and possibly pass entirely through the support wafer. The wafer from which the device is to be produced (referred to as the "device wafer") is bonded to the first side of the support wafer, with a dielectric layer in between, formed either on the first side of the support wafer or the inner side of the device wafer before bonding the wafers.

While the device wafer is bonded to the support wafer, the device wafer is thinned to a required thickness, typically using one or more processes such as wafer grinding, chemical-mechanical polishing (CMP), and wet etching. The support wafer provides the required stability, and the pattern of cavities in the support wafer is typically defined so as to provide uniform support for the device wafer during thinning, while simultaneously enabling subsequent etchant penetration for support wafer removal. Optionally, a pattern of features of the device may then be etched into the device wafer. After the optional etching this pattern, the support wafer and the dielectric layer are removed from the device wafer by applying an etchant, such as hydrofluoric acid (HF), through the cavities to the dielectric layer. This approach substantially reduces the complexity and time required to remove the support wafer once it is no longer needed. The support wafer may then be cleaned and reused.

In yet another embodiment, a semiconductor wafer is bonded during production to a support substrate using an adhesive. While the lower side of the wafer is bonded to the support substrate, the device wafer is thinned to a required thickness, following by an optional etching of features of the device into the upper side of the wafer. Release openings and singulation openings are etched through the wafer down to the support substrate around the area of the device. The adhesive is then debonded so as to release the moving parts of the device and allow the device to be singulated. The remains of the device wafer are removed from the support substrate, which may subsequently be reused.

For the purpose of easy debonding, a support substrate that is transparent to optical radiation may be used, such as a suitable glass substrate. For example, an adhesive that debonds under ultraviolet radiation may be used, and the debonding may be accomplished by irradiating the adhesive with the ultraviolet radiation through the transparent support substrate. Alternatively, other sorts of adhesive may be debonded by heating the support substrate.

Still another group of embodiments uses a support wafer in which a cavity is pre-etched over each of the dies in the device wafer. A pattern of features of the device is optionally etched into one side of the device wafer. The (optionally) patterned side of the device wafer is then bonded to the support wafer with the cavity positioned over the area of the device wafer that contains the pattern. Once the wafers are bonded in this fashion, the other (non-patterned) side of the device wafer is thinned to a predefined thickness.

Release openings are etched into the device wafer around the pattern, such that the release openings pass through the device wafer after the thinning. These release openings may be etched into the patterned side of the device wafer to an appropriate depth (but typically not all the way through) before bonding to the support wafer and thinning. Alternatively, the release openings may be etched through the other (outer) side of the device wafer after bonding and thinning. In either case, the moving part or parts of the device are released along the release openings. Singulation openings may also be etched through the device wafer around the release openings, while the device wafer remains bonded to the support wafer, after which the device is separated along the singulation openings from the remainder of the device wafer, which remains bonded to the support wafer.

Typical Devices

FIG. 1 is schematic, pictorial illustration of a MEMS gimbaled mirror device 20, produced in accordance with an embodiment of the present invention. Mirrors of this sort are described in detail in PCT patent application PCT/IB2013/056101, filed Jul. 25, 2013, whose disclosure is incorporated herein by reference. Device 20 will be described here briefly as an illustrative example of the sorts of devices that can be produced using the methods described hereinbelow. These methods may similarly be applied, however, in producing micro-mechanical devices of other sorts.

Device 20 is made from a thinned silicon wafer, which is etched to produce the structures shown in the figure. The device comprises a micromirror 22, which is coated with a reflective coating 24, such as a thin layer of gold or another metal. Micromirror 22 is attached by hinges 28 to a gimbaled base 26, which in turn is attached by hinges 32 to a peripheral support 30. Micromirror 22 is typically a few millimeters across, with a thickness on the order of 30-150

μm, while hinges 28 and 32 may be even thinner for high twisting flexibility. The parts of device 20 are separated from one another by grooves that pass through the entire thickness of the device. Other features of the device may comprise recesses and other structures that are shallower than the full thickness.

Twisting of hinges 28 and 32, typically driven by a magnetic drive as described in the above-mentioned PCT patent application, scans micromirror 22 about two orthogonal axes over a range that may reach several tens of degrees. In this embodiment, base 26 has wings 34 to which respective magnetic rotor pieces (not shown) ace mounted. Another magnetic rotor piece may be fixed in a recess on the back side of micromirror 22.

Figure 2:
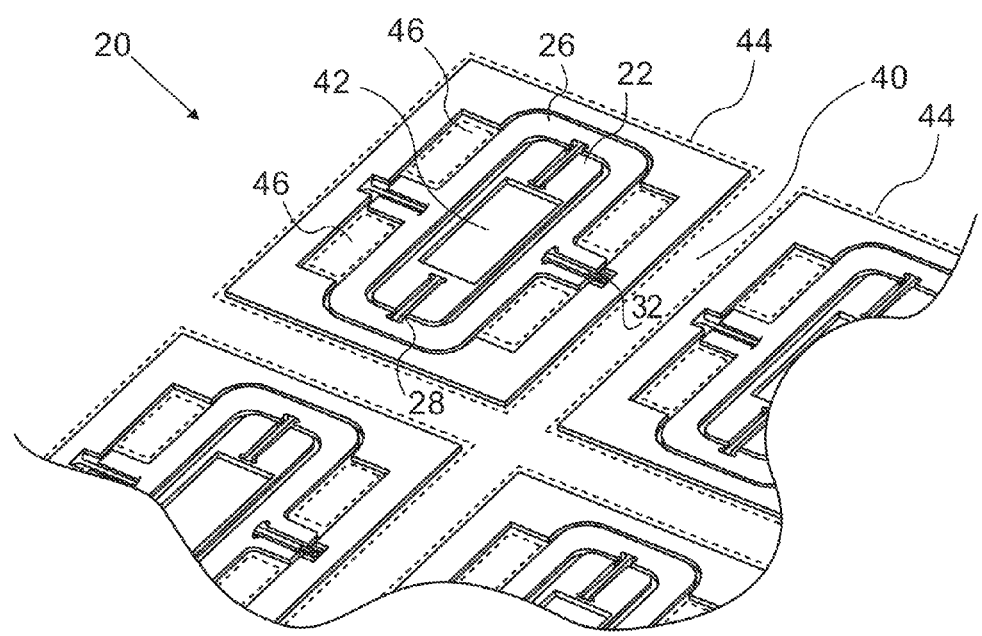
FIG. 2 is a schematic, pictorial illustration of a semiconductor wafer, showing a stage in the production of MEMS gimbaled mirror devices in accordance with an embodiment of the present invention.

FIG. 2 is a schematic, pictorial illustration of a semiconductor wafer 40, showing a stage in the production of MEMS scanning mirror devices 20 in accordance with an embodiment of the present invention. In this view, device 20 is seen from the opposite side from the view shown in FIG. 1. For convenience, the side shown in FIG. 1 will be referred to as the reflective side of device 20, while the side shown in FIG. 2 is referred to as the patterned side. In the pictured example, the pattern comprises a recess 42, which is configured to hold a magnetic rotor piece, as noted above. Alternatively or additionally, the pattern may comprise other features, such as ribs, as described, for example, in the above-mentioned U.S. Pat. No. 7,952,781.

As shown in FIG. 2, multiple devices 20 are fabricated simultaneously on wafer 40. Singulation grooves 44 are etched through the wafer in order to permit the devices to be separated upon completion of the process. Unlike features such as recess 42, which are etched only partially through the thickness of the device, grooves 44 extend through the full thickness of the device. A number of thin tabs may be left across the grooves in order to hold the device in place until all other processing is completed, whereupon the tabs are broken to release the device. Similarly, grooves may be etched around breakaway pieces 46 surrounding the structure of device 20, to enable pieces 46 to be removed in order to leave empty spaces in the device where required. As described below, device 20 may be temporarily connected to the support wafer via thin, breakable tabs between parts of the device and breakaway pieces 46.

For clarity in the description that follows, features such as recess 42 and ribs, which remain a solid part of the finished device, are referred to as "features of the device" or "device features," while openings extending through the full thickness of the finished device, such as grooves 44, are referred to as "through features." Such through features typically include "release openings," along which the moving parts of the device are released from the surrounding parts of the device so that they are able to move. The through features may also include "singulation openings," which are used to remove the device from the surrounding wafer and/or support substrate. The openings in device 20 around mirror hinges 28 and 32 and grooves 44 along the die outline are both examples of through features.

Debondable Support Substrate

Figure 3A:
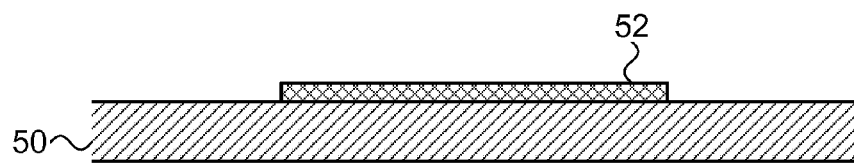
FIGS. 3A-3J are schematic, sectional illustrations showing successive stages in production of a micro-mechanical device, in accordance with an embodiment of the present invention.

FIGS. 3A-3J are schematic, sectional illustrations showing successive stages in production of a micro-mechanical device, in accordance with an embodiment of the present invention. As shown in FIG. 3A, the process starts with a Si wafer 50, at a stable wafer thickness, typically several hundred micrometers. The wafer may be patterned by deposition of a reflective layer on one side of the wafer, typically a metal layer 52 (assuming the target device is to serve as a scanning mirror as in the examples described above). The metal layer may be deposited using any suitable process known in the art, such as lift-off, evaporation or shadow-mask processing.

Figure 3B:
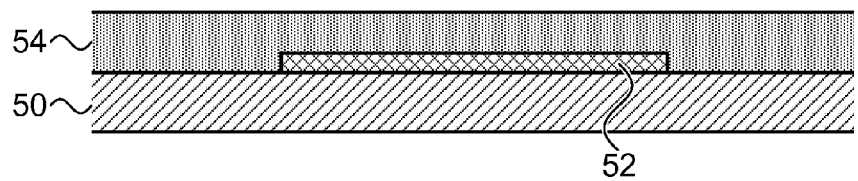

A support substrate, such as a glass wafer 54, is bonded to Si wafer 50, with metal layer 52 facing the glass, as shown in FIG. 3B. This bonding is typically performed using an adhesive that can be subsequently released, for example by optical irradiation, typically in the ultraviolet (UV) range, or by thermal treatment (heating). Use of UV is possible as long as the glass is of a type that is transparent to UV. UV-debondable adhesives are known in the art, such as the adhesives used in Nitto tapes, blue tapes or UV tapes (different names for the same sort of item). Glass wafer 54 may be flat, or may have cavities (not shown) to protect metal layer 52. After bonding to the glass wafer, Si wafer 50 may be thinned to a required thickness, since the glass wafer will maintain the structurally stability of the thinned Si wafer.

Figure 3C:
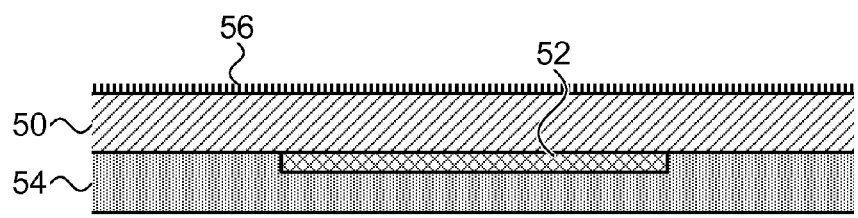
Figure 3D:
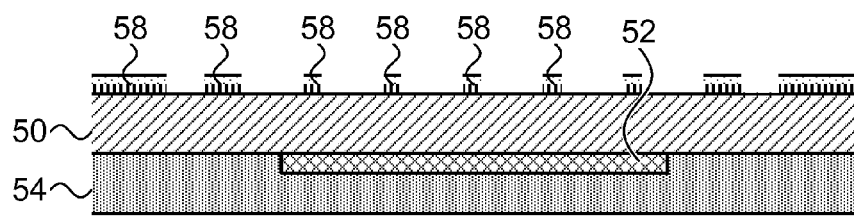
Figure 3E:
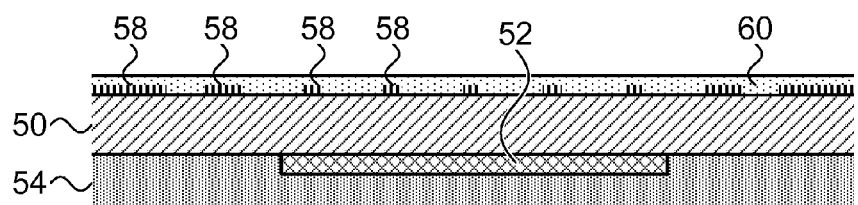
Figure 3F:
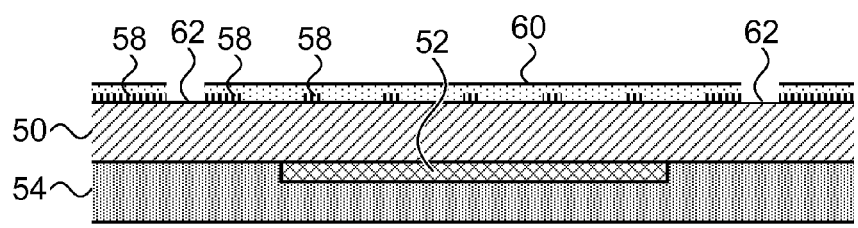
Figure 3G:
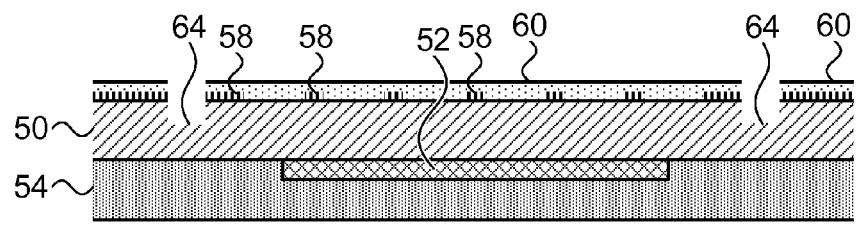

A thin layer 56 of SiO2, typically about 1-2 μm thick, is deposited over the reverse side of wafer 50, opposite metal layer 52 and glass wafer 54, as shown in FIG. 3C. The SiO2 is lithographically patterned and selectively etched, using reactive ion etching (RIE) of SiO2 to define a pattern 58 on the wafer surface, as shown in FIG. 3D. The spaces in pattern 58 from which the SiO2 is removed define the locations of the device features and the through features. A layer of photoresist 60 is deposited over pattern 58, as shown in FIG. 3E, and this layer is then lithographically patterned to remove the photoresist in areas 62 in which through features are to be created, as shown in FIG. 3F. The corresponding through features 64 are then etched, by DRIE, for example, part way through wafer 50, as shown in FIG. 3G.

Figure 3H:
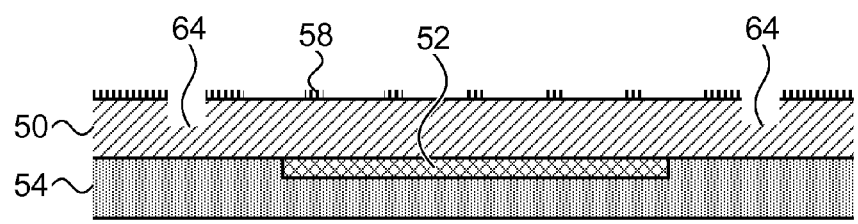
Figure 3I:
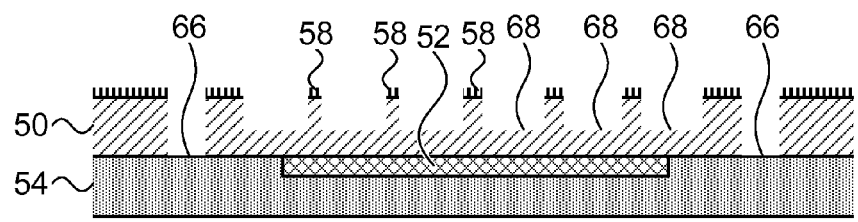

Following this step, as shown in FIG. 3H, photoresist 60 is removed from the surface of wafer 50. The DRIE process is then applied over the entire wafer surface (protected by pattern 58), as shown in FIG. 3I. As a result, features 64 are etched down to the surface of glass wafer 54, creating grooves 66 through the full thickness of wafer 50. Device features, in the form of recesses 68, are simultaneously etched in the spaces in which the Si of wafer 50 is exposed between the lines of pattern 58. Grooves 66 typically include release openings and may include singulation openings, extending through wafer 50 to glass wafer 54 at the die boundaries, so that devices 70 may subsequently be singulated along these grooves.

Figure 3J:
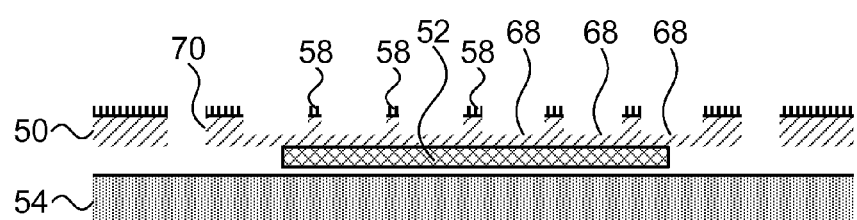

Devices 70 are debonded from glass wafer 54 by suitable optical (UV) or thermal treatment, as shown in FIG. 3J. This debonding may take place either at the fabrication facility or at the packaging facility. Glass wafer 54 remains intact and may be recycled back to the fabrication facility for the next round of production.

FIG. 3, as described above, presents one example of a process that can be implemented using a temporary support substrate, which is subsequently debonded. Variations on this process are possible, such as etching features 68 into a standard wafer, then bonding the etched side of the wafer to the support substrate, thinning the wafer, applying the reflective coating, then patterning and etching the through features, all from the side of the wafer distal to a support wafer.

Support Wafer with Pre-Formed Device Cavities

Figure 4A:
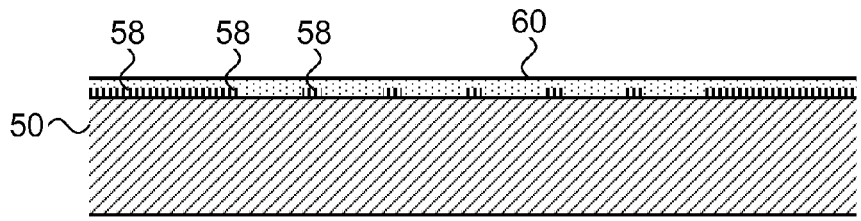
FIGS. 4A-4I are schematic, sectional illustrations showing successive stages in production of a micro-mechanical device, in accordance with another embodiment of the present invention.
Figure 4B:
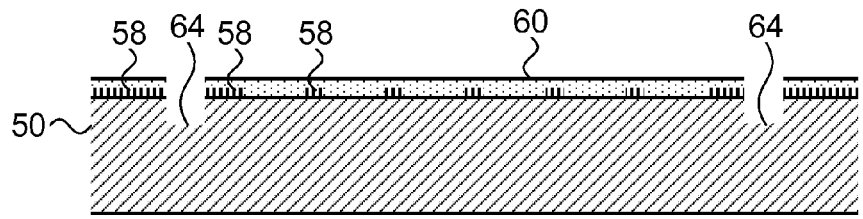
Figure 4C:
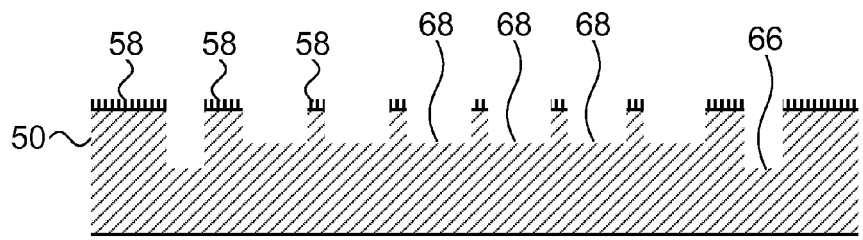

FIGS. 4A-4I are schematic, sectional illustrations showing successive stages in production of a micro-mechanical device, in accordance with another embodiment of the present invention. The initial steps of the process, illustrated in FIGS. 4A-4C, are similar to those in FIGS. 3C-3I, except that no support substrate is used at these stages in the present embodiment. The same indicator numbers are therefore used in FIGS. 4A-4C as in FIGS. 3C-3I to indicate the same structures, although in the absence of a support substrate, wafer 50 in the present embodiment may be thicker at this stage than in the preceding embodiment.

Figure 4D:
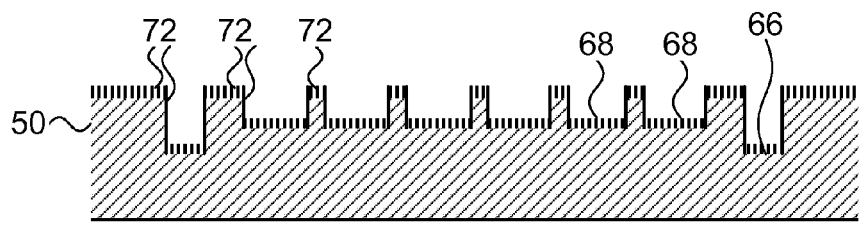

After application of SiO2 pattern 58 and etching of features 64, as illustrated in FIG. 4B, DRIE is applied to create grooves 66 and recesses 68, as shown in FIG. 4C. Grooves 66 are etched to a greater depth than recesses 68, but to less than the full thickness of wafer 50 at this stage. A further SiO2 coating 72 may be then deposited over the entire patterned surface of wafer 50, as shown in FIG. 4D, to protect the patterned features in the subsequent processing. Coating 72 may be applied by a thermal process, as is known in the art.

Figure 4E:
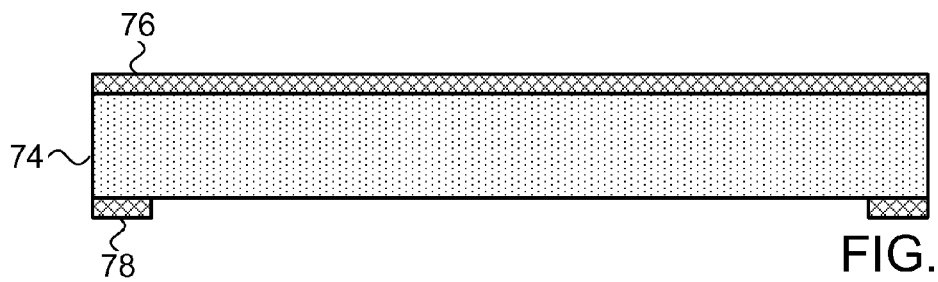

In a separate process, as shown in FIG. 4E, a second Si wafer 74, referred to as a support wafer, is patterned with protective layers 76 and 78 on its opposing surfaces. For example, layers 76 and 78 may comprise silicon nitride (Si3N4). Layer 78 is lithographically patterned and then etched, typically using RIE, to create the desired pattern, which defines the location of cavities to be etched into wafer 74.

Figure 4F:
Figure 4F:
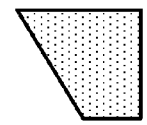

Wet etching is then applied to wafer 74 to create the cavities in the wafer, with a cavity 80 corresponding to each die in wafer 50, as illustrated in FIG. 4F. Wet etching is a cost-effective process, in which the wafers are bathed in an etching solution, such as KOH. Wafers can be put in cassettes, and, using appropriate etch-rate homogenization techniques, as are known in the art, the etch rate can be made very uniform across each wafer and between different wafers in the cassette. Layers 76 and 78 protect wafer 74 from the wet etch, so that cavity 80 is formed from the lower side of the wafer (in the view shown in the figures), with patterned layer 78, to the upper side, which is protected by unpatterned layer 76. Alternatively, mechanical protection during wet etching may be used instead of layer 76 in case no patterning of this layer is required. Layers 76 and 78 are then removed after the cavities are formed.

Figure 4G:
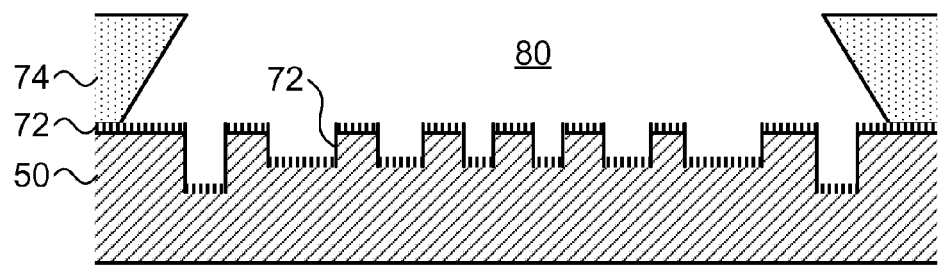

Following the separate etching stages that are applied to the device and support wafers, wafers 50 and 74 are then bonded together, as shown in FIG. 4G, using any suitable wafer bonding technique that is known in the art, such as fusion bonding. The side of wafer 50 that has been patterned and etched is bonded to wafer 74 so that cavity 80 is aligned and positioned over the area of wafer 50 that contains the pattern. Alternatively, depending on space constraints and other considerations, the other side of wafer 50 may be bonded to wafer 74.

Figure 4H:
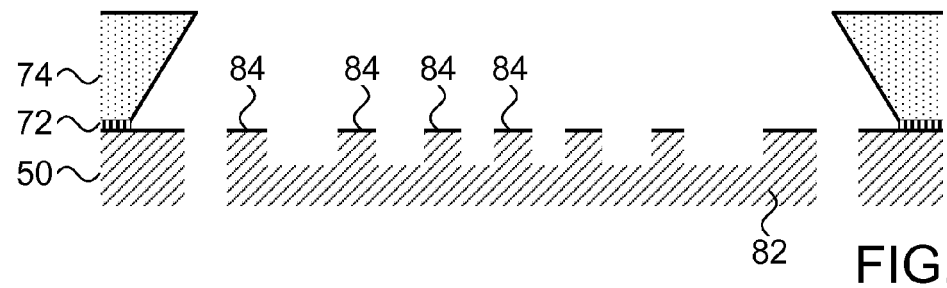

While wafers 50 and 74 are bonded together in this fashion, the opposite, outer side of wafer 50 is thinned to the required thickness, typically on the order of 30-150 μm, as illustrated in FIG. 4H. Grinding and chemical-mechanical polishing (CMP) techniques, as are known in the art, may be used for this purpose. Since the features of the device were already defined by etching before wafer thinning, this last stage should not apply physical force on the device, and can be accomplished, for example, by polishing followed by a non-mechanical process, such as wet etching, to ensure a smooth mirror surface. Wafer 74 provides mechanical support to wafer 50 during this process. Coating 72 may also be chemically removed from the exposed surface of wafer 50, thus uncovering device features 84.

As a result of the thinning process, grooves 66 (marked in FIGS. 4C and 4D) now become release openings that extend through the full thickness of wafer 50. These grooves will be used, as explained above, to separate the moving parts of a device 82 that has been produced by the above process from the surrounding parts. Grooves 66 may also serve as singulation openings, to separate device 82 from wafer 74, as well as from the remainder of wafer 50 that remains bonded to wafer 74. Wafer 74 may subsequently be cleaned and reused.

Figure 4I:
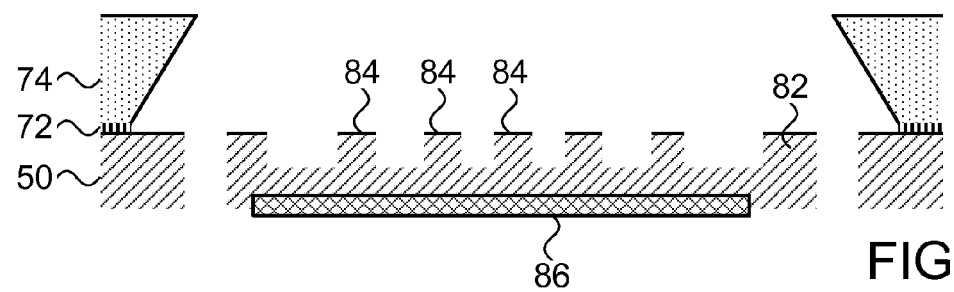

Typically, before device 82 is separated from wafer 74, a reflective layer 86 is deposited on the thinned side of wafer 50, opposite the side with features 84, as shown in FIG. 4I. (Layer 86 is needed if device is to serve as a scanning mirror, but of course may not be needed in other sorts of MEMS devices.) Layer 86 may be deposited using any suitable technique known in the art, such as shadow mask or spray coating techniques.

FIGS. 5A-5I are schematic, sectional illustrations showing successive stages in production of a micro-mechanical device, in accordance with yet another embodiment of the present invention. This embodiment is similar to that of FIGS. 4A-4I, except that the release openings are formed through the outer side of the wafer 50 (i.e., the side facing away from support wafer 74) after bonding and thinning.

Figure 5A:
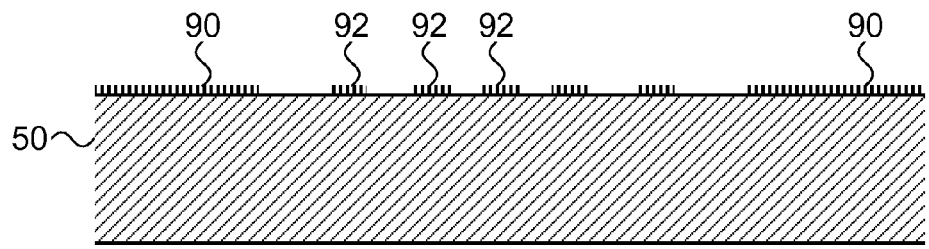
FIGS. 5A-5I are schematic, sectional illustrations showing successive stages in production of a micro-mechanical device, in accordance with yet another embodiment of the present invention.
Figure 5B:
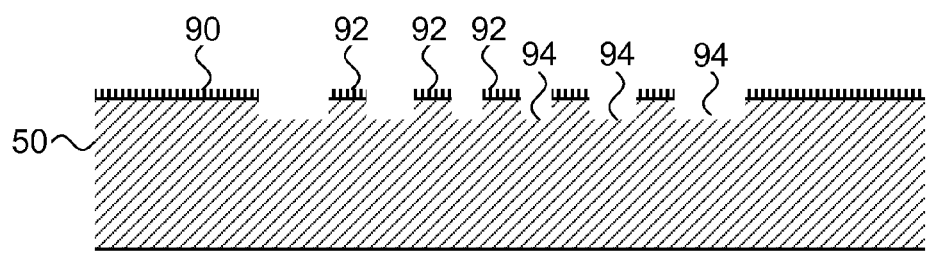
Figure 5C:
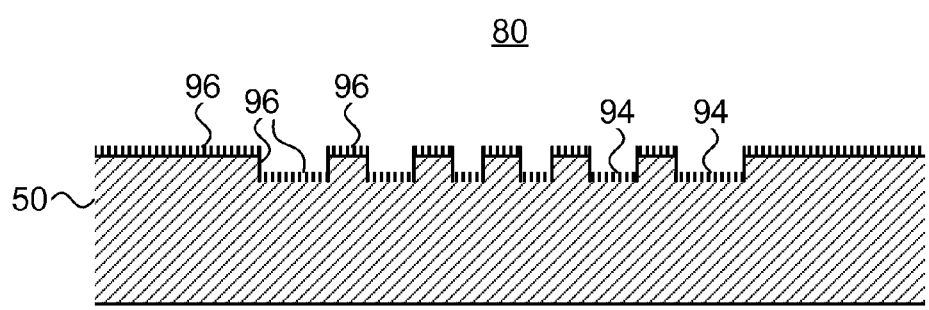

In this embodiment, a peripheral pattern 90 and a device pattern 92 are etched in a layer of SiO2 on the surface of wafer 50, as shown in FIG. 5A. Device pattern 92 defines the locations of device features, while pattern 90 covers the surrounding area of wafer 50, including the areas that are to be bonded to support wafer 74 and the areas in which the release openings will subsequently be made. Device features 94 are etched in the spaces defined by pattern 92, as shown in FIG. 5B, using DRIE, for example. A further SiO2 coating 96 is then deposited over wafer 50, including features 94, as shown in FIG. 5C.

Figure 5D:
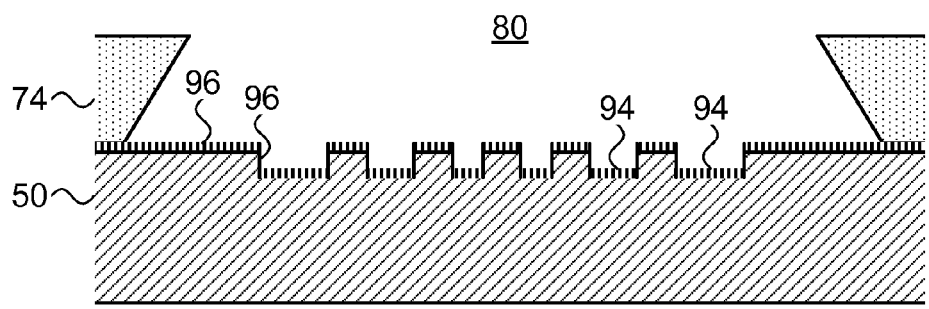
Figure 5E:
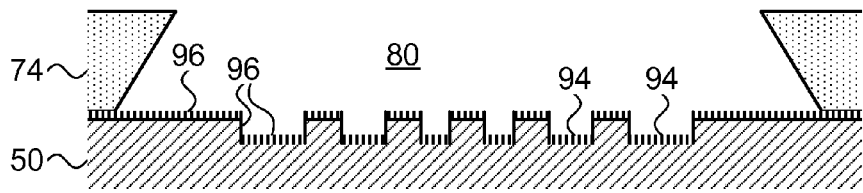

Cavities 80 are formed in wafer 74, as explained above, and wafer 50 is then bonded to wafer 74, with features 94 facing into and aligned with cavity 80, as shown in FIG. 5D. While bonded to wafer 74, wafer 50 is thinned, typically by grinding and CMP and/or wet etching, as shown in FIG. 5E. It may be advantageous to use non-mechanical techniques in the final stages of thinning wafer 50, in order to avoid possible development of local curvature in wafer 50 as a result of mechanical pressure and lack of local support from wafer 74.

Figure 5F:
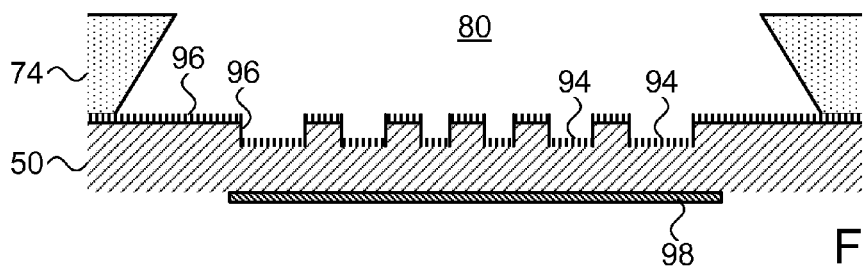

After thinning, a reflective layer 98 may be deposited on the outward-facing side of wafer 50, as shown in FIG. 5F (i.e., on the lower side of wafer 50 in the view shown in the figures). In this embodiment, since no openings have yet been formed in this outer side of wafer 50, any suitable process can be used to apply layer 98, including coating the entire wafer surface with metal and then patterning the surface to leave the metal layer in place only where desired.

Figure 5G:
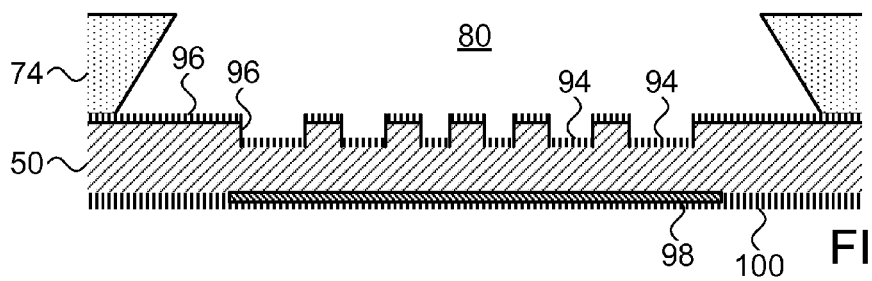
Figure 5H:
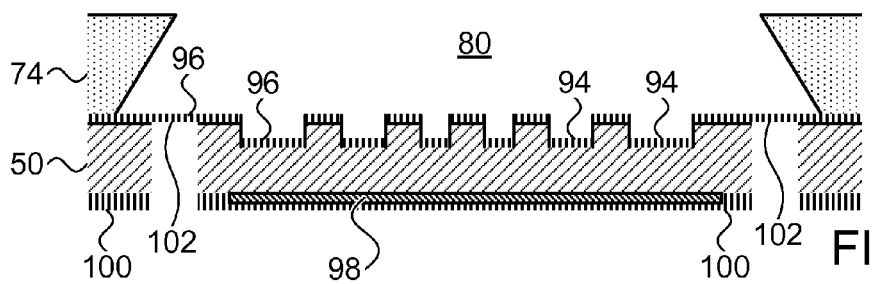
Figure 5I:
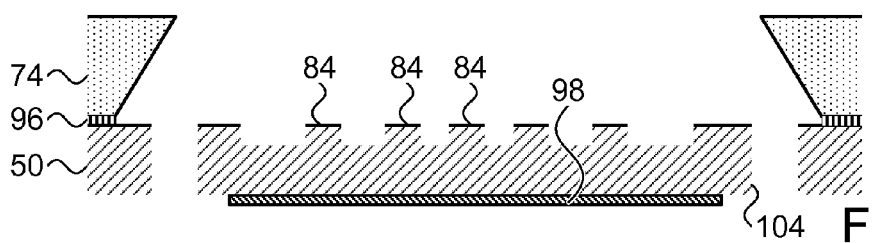

In order to form the "through" features, including release openings and possible singulation openings, an SiO2 coating 100 is deposited over the outer surface of wafer 50, as shown in FIG. 5G. Coating 100 is patterned by photolithography to define the locations of grooves 102. These grooves are then etched through the entire thickness of wafer 50, as shown in FIG. 5H, typically using the techniques of RIE and DRIE that are described above. SiO2 coatings 96 and 100 protect the areas that are not to be etched at all stages of this process, in order to prevent over-etching and wafer-scale non-uniformity. Coatings 96 and 100 are then removed when they are no longer required (by buffer HF etching, for example), as shown in FIG. 5I. Alternatively, an appropriate photoresist layer may be used instead of coating 100, and then removed after etching by appropriate chemicals. A resulting device 104 is thus released and may also be singulated from wafer 74, as well as from the remainder of wafer 50 that remains bonded to wafer 74.

Figure 6A:
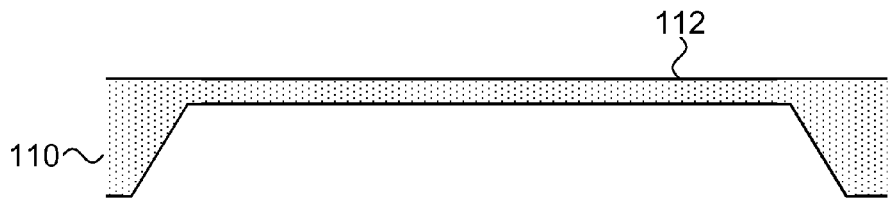
FIGS. 6A-6E are schematic, sectional illustrations showing successive stages in production of a micro-mechanical device, in accordance with a further embodiment of the present invention.
Figure 6B:
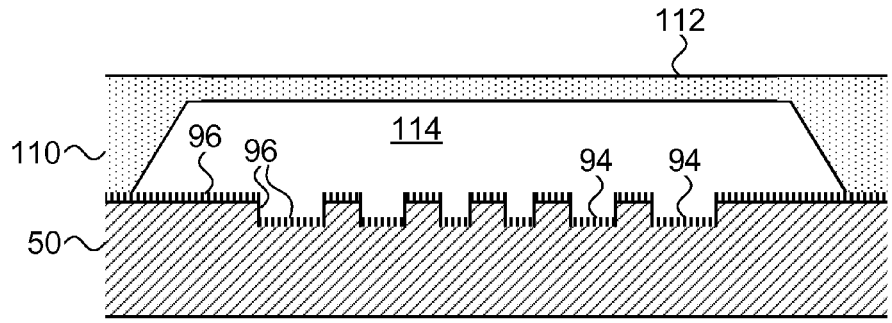

FIGS. 6A-6E are schematic, sectional illustrations showing successive stages in production of a micro-mechanical device, in accordance with a further embodiment of the present invention. This embodiment is similar to the preceding embodiment, except that in this case, a cavity 114 is initially formed only part way through a support wafer 110, leaving a thin cover 112 over the cavity on one side. As shown in FIGS. 6A and 6B, wafers 50 and 110 are aligned so that cavity 114 opens toward the side of wafer 110 that is proximal to wafer 50, while the distal side of the cavity, opposite the proximal side, remains closed. The side of wafer 50 in which features 94 are formed is then bonded to the proximal side of wafer 110 (after application of SiO2 coating 96, as described above).

Figure 6C:
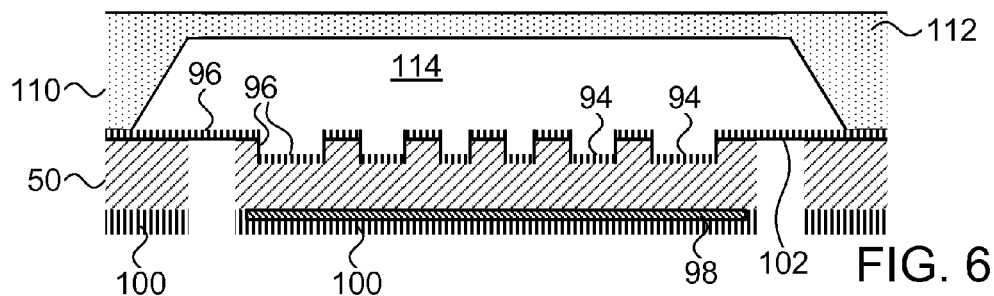

Keeping cavity 114 closed in this manner during thinning of wafer 50 can have a number of advantages. The presence of cover 112 adds some mechanical strength to wafer 110. Furthermore, some machines (such as grinding and polishing machines having vacuum chucks) may work better when the surface of support wafer 110 that they grasp is vacuum-tight, as can be accomplished as long as cover 112 is left in place. Thus, cover 112 remains in place as wafer 50 is thinned, and possibly while grooves 102 are formed through the thinned wafer thereafter, as shown in FIG. 6C.

Figure 6D:
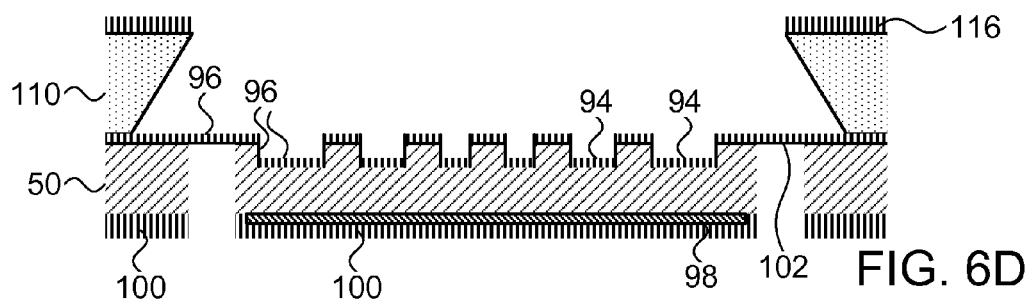
Figure 6E:
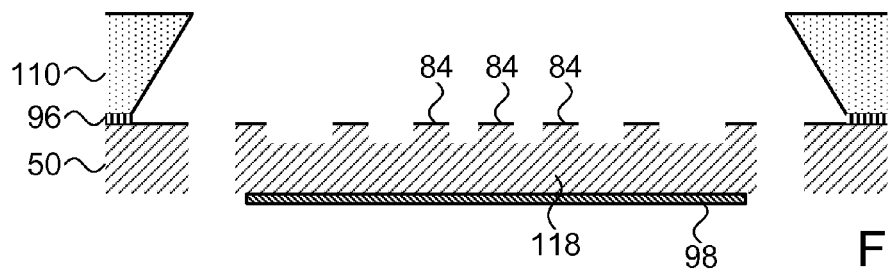

After vacuum is no longer required, a SiO2 coating 116 is applied around the periphery of cover 112. The cover is then removed, for example by DRIE, as shown in FIG. 6D. Alternatively, cover 112 may be ground off. Coatings 96 and 100 are removed, as well, and a resulting device 104 is thus released, as shown in FIG. 6E.

Further alternatively, if grooves 102 include singulation openings, device 104 may be separated from wafer 50 along the appropriate grooves. In this case, there may be no need for cover 112 to be removed, so that wafer 110 can simply be cleaned and then reused.

One of the features of wet etching processes (such as KOH etching), when applied to crystalline Si, is that the edges of the cavities that they create in the wafer have an inherent slope, as illustrated by the shapes of cavities 80 and 114 in the foregoing embodiments. For example, processing a <1,0,0> wafer in this manner will create cavities with a slope of 54.74° around their edges, on account of the orientations of the crystal planes of Si. This slope creates a large variation in the area of the cavity as a function of depth, which may be undesirable in some applications.

Figure 7A:
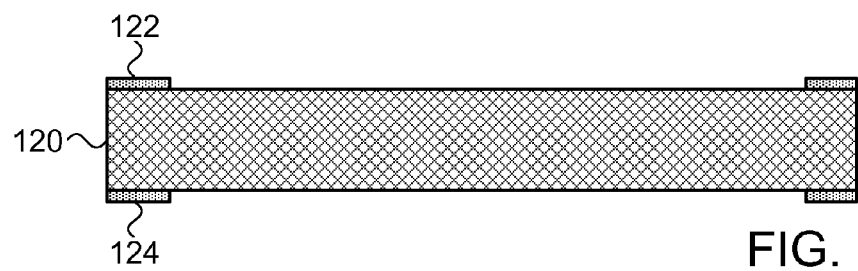
FIGS. 7A and 7B are schematic, sectional illustrations showing stages in production of a support wafer used in producing a micro-mechanical device, in accordance with an embodiment of the present invention.
Figure 7B:
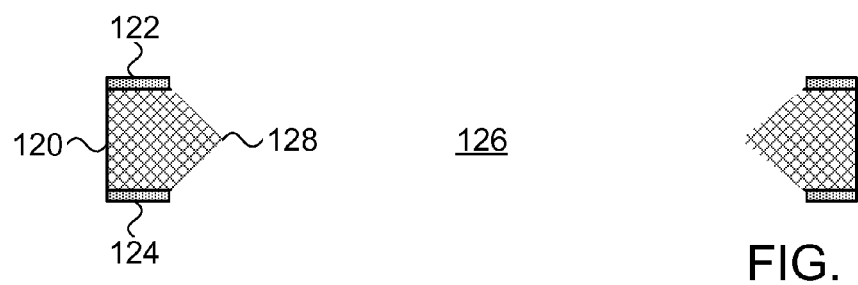

FIGS. 7A and 7B are schematic, sectional illustrations showing stages in production of a support wafer 120 used in producing a micro-mechanical device, in accordance with an embodiment of the present invention. In this case, both of protective layers 122 and 124 on the opposing surfaces of wafer 120 (typically layers of Si3N4) are lithographically patterned and then etched. A wet etching process is then applied to both the proximal and distal sides of wafer 120 in order to form a cavity 126. Such dual-sided etching eliminates the difference between the cavity size on the two sides of the wafer, while reducing the variation of cavity size with depth a factor of two, since the inward slopes of the cavity from both sides terminate along a central line 128.

Simplified Removal of Support Layer

Figure 8A:
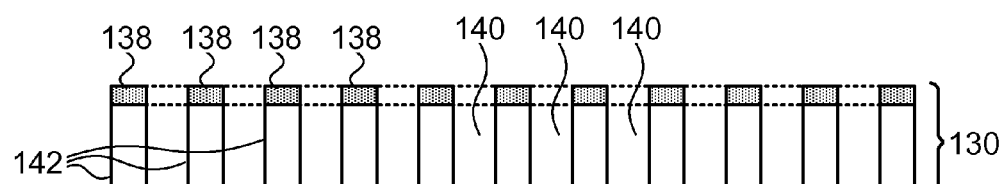
FIGS. 8A-8H are schematic, sectional illustrations showing successive stages in production of a micro-mechanical device, in accordance with an alternative embodiment of the present invention.
Figure 8B:
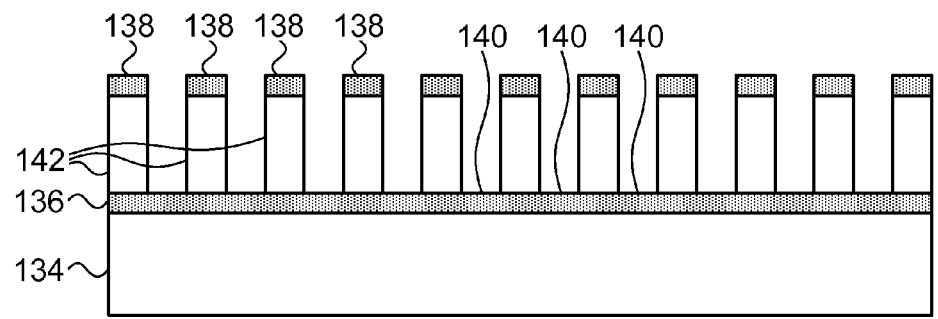

FIGS. 8A-8H are schematic, sectional illustrations showing successive stages in production of a micro-mechanical device, in accordance with an alternative embodiment of the present invention. This embodiment makes use of a support wafer 130, having cavities 140 extending therethrough, as shown in FIG. 8A. Wafer 130 is bonded to a device wafer 134, as shown in FIG. 8B, with a dielectric layer 136 in between. Typically, layer 136 comprises SiO2 and is deposited on the surface of either wafer 130 or wafer 134 before they are bonded together.

To produce cavities 140, wafer 130 is covered with an external SiO2 layer 138, and this external layer is then patterned and etched to create the mask for etching the cavities. Alternatively, the mask for etching the cavities may be created by application and patterning of a photoresist layer without the need for SiO2. Cavities 140 are then selectively etched to a selected depth using DRIE or by a wet etching process using the mask. A remainder 142 of wafer 130 after etching still has sufficient mechanical strength to provide the necessary support to a device wafer 134. Alternatively or additionally, other patterns of cavities (not shown), including vertical and/or horizontal cavities, may be formed within support wafer 130, opening through the surface of wafer 130 that is bonded to wafer 134 and reaching dielectric layer 136. An example of such an alternative pattern, in which the cavities extend only part way through the support wafer, in shown in FIGS. 12A-12J. In any case, the support wafer may typically be cleaned and reused after completion of the process shown in FIGS. 8A-8H or FIGS. 12A-12J, so that the time-consuming process of forming the cavities need not be repeated.

Figure 8C:
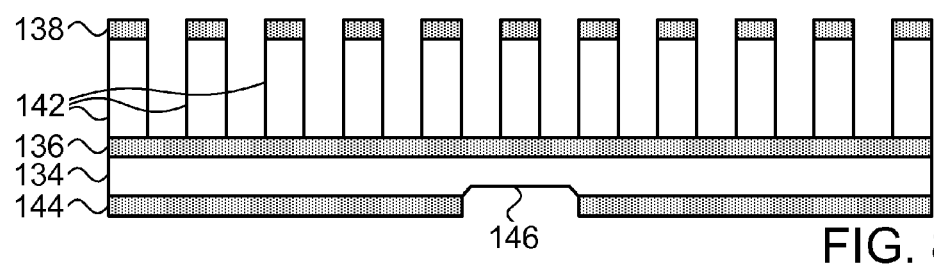
Figure 8D:
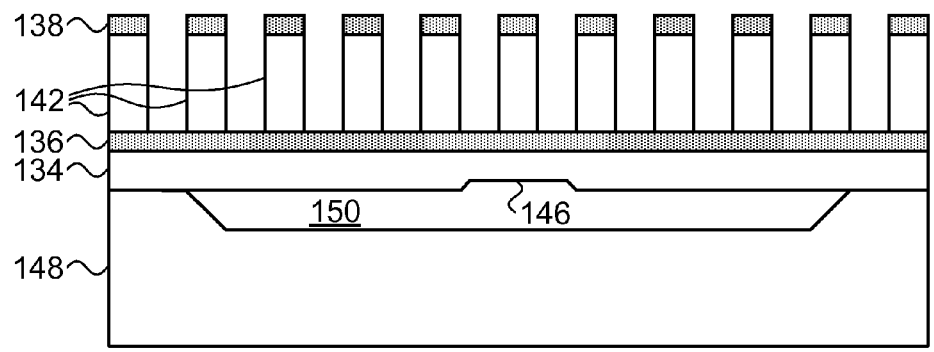

After making the preparations described above, wafer 134 is thinned, typically by grinding and polishing, with the support of support wafer 130. A protective layer 144, such as SiO2 and/or Si3N4, may then be deposited on the outer surface of wafer 134 and may optionally be patterned in order to etch a pattern of features 146 of the device into wafer 134, as shown in FIG. 8C. (In this example, just a single feature is shown for the sake of simplicity. More generally, the term "feature" may refer to any modification of the shape of wafer that goes into making the resulting device, including simply thinning the wafer.) After etching this pattern, the outer surface of wafer 134 is mounted on a support structure 148, as shown in FIG. 8D. Support structure 148 in this case may be a support wafer, which will stay in place through the rest of the process until the device is singulated, and has a cavity 150 below the device area of wafer 134.

Figure 8E:
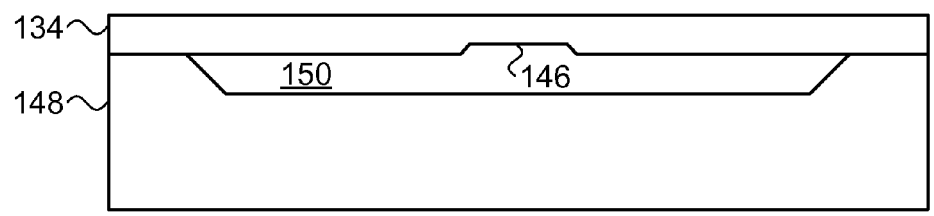

Remainder 142 of wafer 130 and layer 136 are then removed from wafer 134 by applying an etchant through cavities 140 to dielectric layer 136. For example, an HF-based etchant is effective in decomposing and detaching SiO2 from silicon and can be used for this purpose. Once the SiO2 in layer 136 has decomposed, remainder 142 of wafer 130 will simply pull away from wafer 134, which remains supported by support structure 148, as shown in FIG. 8E.

Figure 8F:
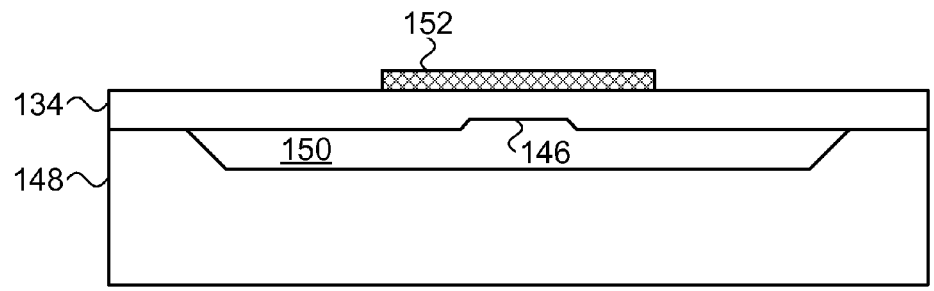
Figure 8G:
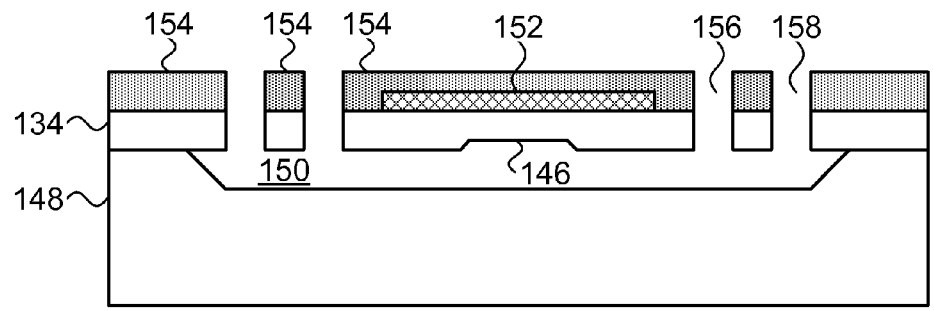

At this stage, the inner surface of wafer 134 is exposed, and a reflective layer 152, such as gold or another metal, can be deposited on the exposed inner surface, as shown in FIG. 8F. This surface is then coated with a photoresist layer 154, and the photoresist is patterned to define the through features of the device. The through features in this example comprise both release openings 156 and singulation openings 158, which are etched through device wafer 134 into cavity 150, as shown in FIG. 8G. This etching step may use RIE and/or DRIE, for example.

Figure 8H:
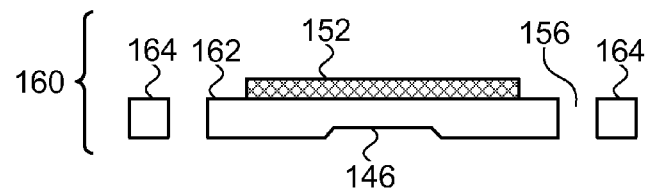

Singulation openings 158 typically surround the etched pattern of features 146 and openings 156, as illustrated in FIG. 8H. The singulation openings may contain tabs (not seen in this figure) that can be broken to release a device 160 from support structure 148. The part of wafer 134 that is not a part of the final device is used to provide "anchors" to hold the device until the tabs are broken and the device is singulated. This remaining part of the wafer typically remains attached to the support structure, but may thereafter be cleaned off if the support structure is to be reused. Device 160 in this example comprises a micromirror 162, which is coated by reflective layer 152 and is attached by hinges (as shown in FIG. 1) extending across openings 156 to a base 164.

Figure 12A:
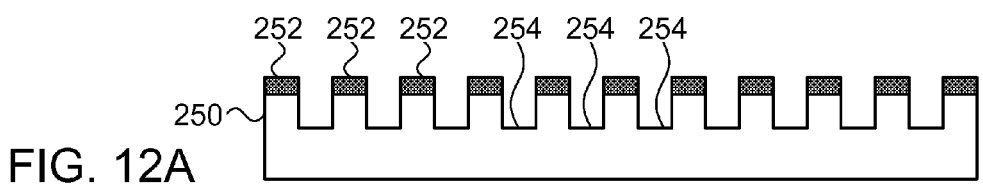
FIGS. 12A-12J are schematic, sectional illustrations showing successive stages in production of a micro-mechanical device, in accordance with a further embodiment of the present invention.
Figure 12B:
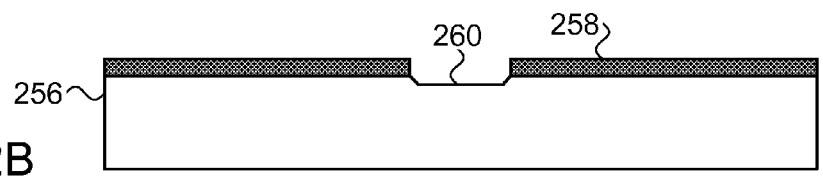

FIGS. 12A-12J are schematic, sectional illustrations showing successive stages in production of a micro-mechanical device, in accordance with a further alternative embodiment of the present invention. This embodiment is similar in principle to the embodiment of FIGS. 8A-8H, but uses a support wafer 250 in which cavities 254 are etched only part way through the wafer, as shown in FIG. 12A. Furthermore, the process of FIGS. 12A-12J does not use additional support structure and has a different singulation procedure from that used in the preceding embodiment. Cavities 254 are typically etched by depositing and patterning a dielectric layer 252 on one surface of wafer 250, and then etching through the dielectric layer openings into the wafer using DRIE or wet etching, for example.

Figure 12C:
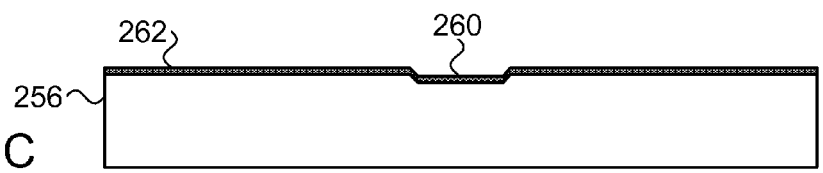
Figure 12D:
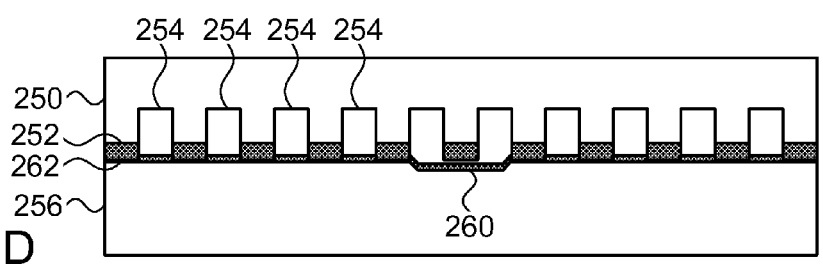

A protective layer 258, such as SiO2 and/or Si3N4, or a photoresist layer if the subsequent etching is to be performed by DRIE, is deposited on the surface of a device wafer 256, and is then patterned in order to etch a pattern of features 260 of the device into wafer 256, as shown in 12B. (In this example, again, just a single feature is shown for the sake of simplicity.) After etching this pattern, an oxide layer 262 is deposited over the surface of wafer 256, as shown in FIG. 12C. This surface of wafer 256 is then bonded to the surface of wafer 250 through which cavities 254 open, with oxide layer 262 interposed between the two wafer surfaces, as shown in FIG. 12D.

Figure 12E:
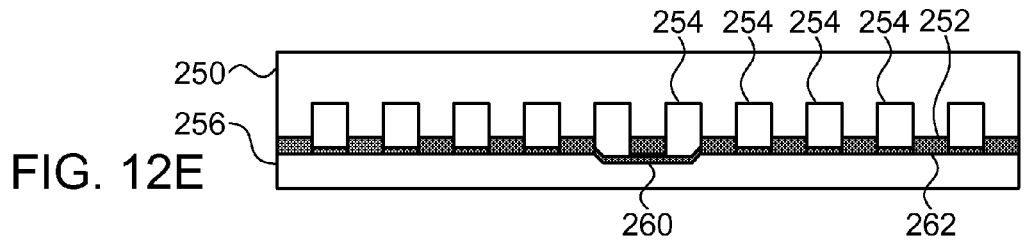
Figure 12F:
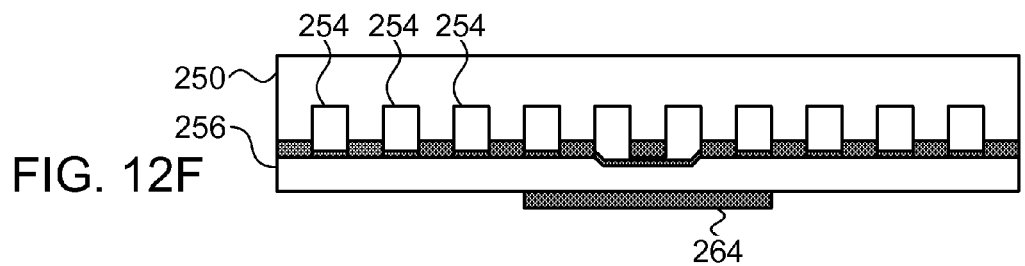

In this bonded configuration, the outer side of wafer 256 is thinned, typically by polishing and grinding, as shown in FIG. 12E. In this manner, the thickness of wafer 256 is reduced to the target device thickness. A reflective layer 264, such as gold or another metal, can be deposited in this stage on the outer surface of wafer 256, as shown in FIG. 12F.

Figure 12G:
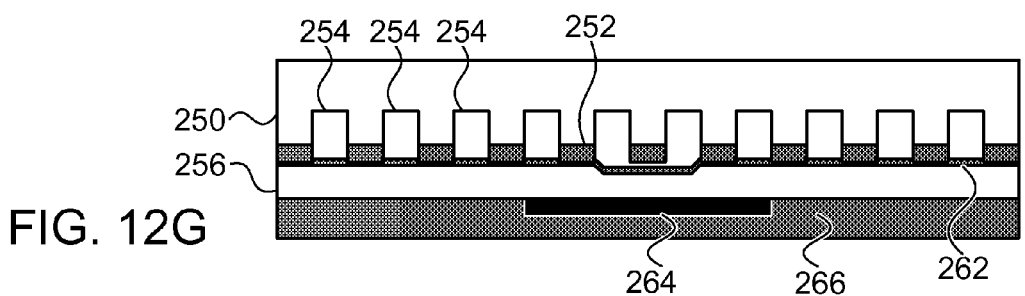
Figure 12H:
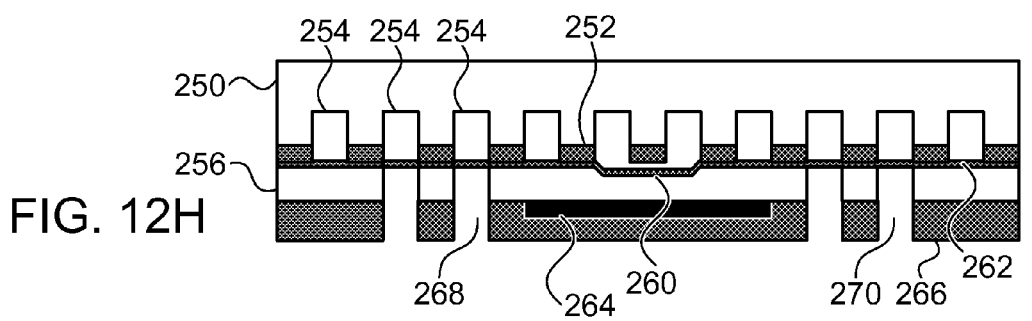

A layer of photoresist 266, is now deposited over the outer surface of wafer 256, as shown in FIG. 12G. (The photoresist may also cover reflective layer 264.) The photoresist is then patterned by photolithography, and the wafer is etched to create through features passing through wafer 256, including both release openings 268 and singulation openings 270, as shown in FIG. 12H. These openings are etched all the way through wafer 256 to oxide layer 262. This etching step may use RIE and/or DRIE, for example.

Figure 12I:
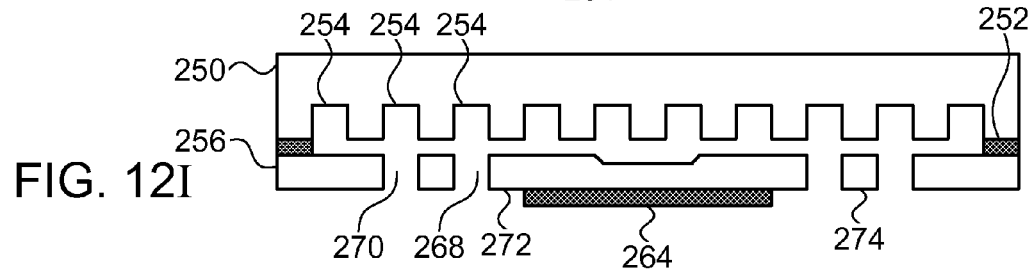

After the etching is completed, the remains of photoresist layer 266 are removed, either by a dry process (such as plasma ashing) or a wet process (for example, using acetone, "piranha," or a dedicated resist-removal chemical. The SiO2 layer 262 is etched away e.g. by HF fumes or wet process, as shown in FIG. 12I. This etching process is controlled, however, so that parts of layer 252 (and/or of oxide layer 262) remain at the periphery of the device die. Consequently, a part of wafer 256 that surrounds the device (but is separated from it by openings 270) remains bonded to support wafer 250.

Figure 12J:
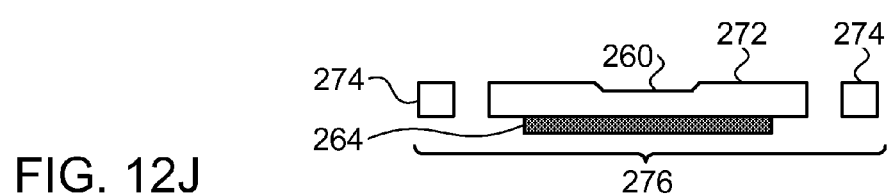

A device 276 may then be singulated, for example by breaking tabs (shown in FIG. 13) extending across openings 270 to separate the device from the remainder of wafer 256, as shown in FIG. 12J. Device 276 in this example comprises a micromirror 272, which is coated by reflective layer 264 and is attached by hinges (as shown in FIG. 1) extending across openings 268 to a base 274.

Figure 13:
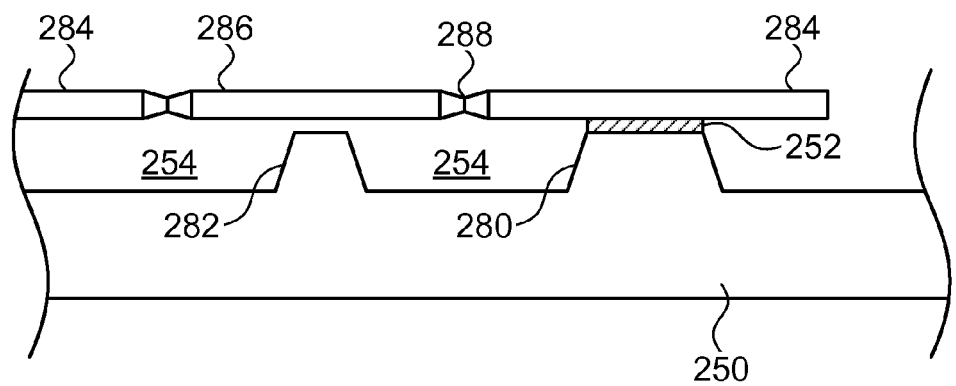
FIG. 13 is a schematic, sectional illustration showing a stage in production of a micro-mechanical device, in accordance with an embodiment of the present invention.

FIG. 13 is a schematic, sectional illustration showing a stage in production of a micro-mechanical device, in accordance with an embodiment of the present invention. This figure corresponds, in terms of process steps, to the stage shown in FIG. 12I. It illustrates how the photolithographic process applied in the stage of FIG. 12H to form singulation openings can leave tabs 288 extending across the singulation openings between a device 286 and a remaining portion 284 of the device wafer. Portion 284 may correspond, for example, to breakaway pieces 46 (FIG. 2) and/or to the area of the device wafer at the edges of the die, surrounding each device. Tabs 288 are broken in order to separate the device from the remaining portion of the wafer.

In this example, cavities 254 in support wafer 250 define protrusions 280 and 282 that extend between the cavities and contact the device wafer, wherein protrusions 280 and 282 are of different sizes. The features of device 286 are formed in the area of wafer 284 that is in contact with protrusions 280, and singulation openings 270 (FIG. 12I) are etched through wafer 284 around this area. Because protrusions 280 are larger than protrusions 282, the etchant applied following the stage of FIG. 12H removes dielectric layer 252 from protrusions 282 more rapidly than from protrusions 280.

The etching process is stopped when layer 252 has been sufficiently removed to free device 286 from protrusion 282, while leaving sufficient dielectric material so that protrusions 280 remain bonded to portion 284 of the device wafer, as shown in FIG. 13. Narrow tabs 288 connecting device 286 to remaining portion 284 across singulation openings 270 may be broken, for example, by exerting a light downward force on the edge of portion 284 adjacent to the tab. Device 186 is then separated from the remaining portion of the wafer along the singulation openings while the remaining portion of the wafer remains bonded to protrusions 280.

Device Production Using a Single Wafer without Support

Figure 9A:
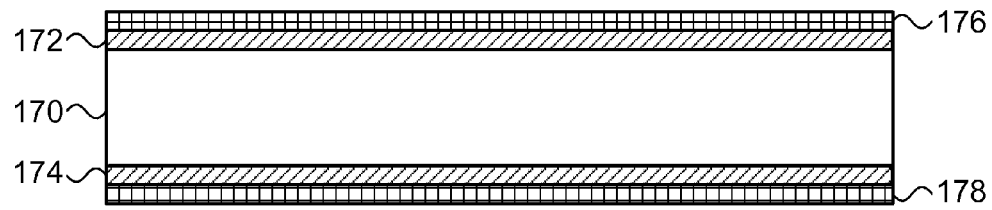
FIGS. 9A-9J are schematic, sectional illustrations showing successive stages in production of a micro-mechanical device, in accordance with another alternative embodiment of the present invention.

FIGS. 9A-9J are schematic, sectional illustrations showing successive stages in production of a micro-mechanical device, in accordance with another alternative embodiment of the present invention. In this embodiment, dielectric layers are deposited on at least one side of a Si wafer 170, and typically on both sides, as shown in FIG. 9A. Typically, the starting thickness of wafer 170 at this stage in the range of 200-500 µm (depending on wafer size, equipment capabilities and the processed wafer stability requirements), before deposition of the dielectric layers. In the present example, the dielectric layers are made up of SiO2 and Si3N4 sub-layers. SiO2 sub-layers 172 and 174 are first deposited on both sides of wafer 170, and then Si3N4 sub-layers 176 and 178 are deposited over the SiO2.

In this embodiment, sub-layers 174 and 178 will be removed from most of wafer 170 before thinning the wafer, while sub-layers 172 and 176 will be removed from the wafer only after thinning is done. Sub-layers 172 and 176 are used to protect the second side of the wafer while the first side is being wet etched. Alternatively, only one of these sub-layers, such as Si3N4 sub-layer 176, may be sufficient for this purpose. Further alternatively, the second side of the wafer may be protected by mechanical means (such as a vacuum chuck) during wet etching of the first side.

Figure 9B:
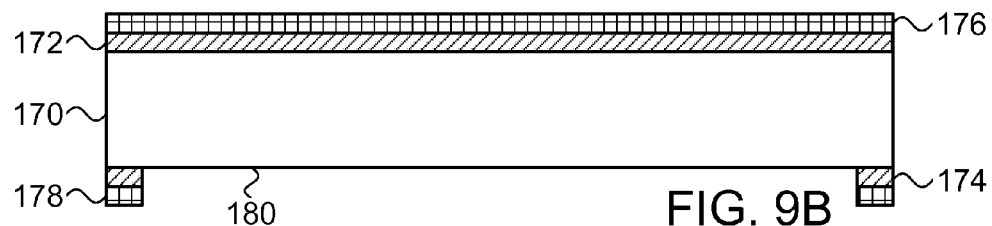

To permit both etching of device features and thinning of wafer 170, sub-layers 174 and 178 are left in place around the perimeter of the device that is to be produced, so as to prevent thinning of the perimeter during the wet etching process. For this purpose, sub-layers 174 and 178 are etched away from an area 180 of wafer 170 that is to contain the pattern, so as to expose the silicon surface in the area, as shown in FIG. 9B, while sub-layers 174 and 178 remain in place around the perimeter of the device area. Sub-layer 178 (Si3N4) may be etched by RIE, followed by etching of layer 174 (SiO2) by buffered oxide etching (BOE), as is known in the art, or by another suitable HF-based etching process.

Alternatively, it is possible, in this and other embodiments, to apply only Si3N4 layer 174, without an oxide layer, and to etch layer 174 selectively using RIE. In this case, care should be taken to stop the RIE in time to avoid roughening the underlying Si surface.

Figure 9C:
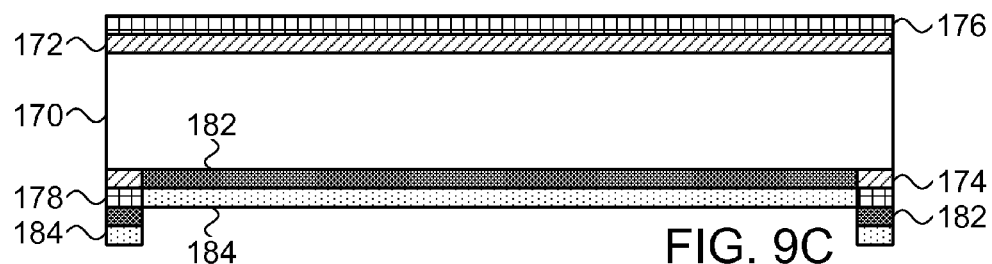
Figure 9D:
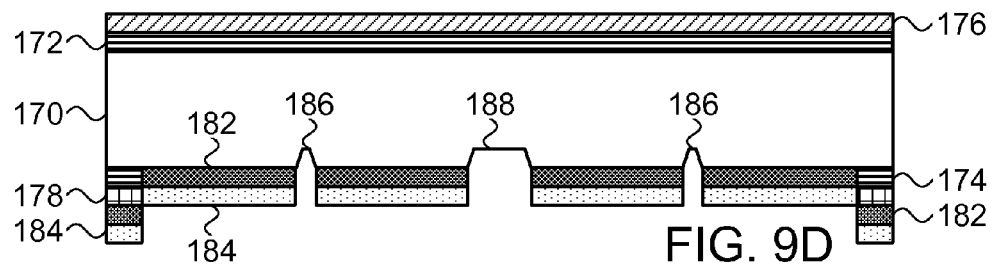

A further dielectric layer, comprising a SiO2 sub-layer 182 and a Si3N4 sub-layer 184, is then deposited over the exposed silicon and over the remaining sub-layers 174 and 178 at the device perimeter, as shown in FIG. 9C. Using a photoresist-patterned dry etching process, such as RIE (for the Si3N4 layer), followed by BOE (for the SiO2 layer), a pattern of features 186, 188 of the target device is etched through sub-layers 184 and 182 into area 180 of wafer 170 that was previously exposed. This step is followed by a wet etching process (using a KOH bath, for example), to create the features, as illustrated in FIG. 9D.

After etching the pattern, sub-layers 184 and 182 are stripped from the entire wafer area, using suitable nitride and oxide stripping processes. Nitride can be stripped away, for example, by a wet process of hot phosphoric acid, while oxide can be stripped by BOE. In order to protect the surface of etched features 186, 188 during the nitride and oxide strip, a thermal oxide process can be applied to the wafer (not shown), wherein the oxide will grow only on the surface of features 186, 188 since the rest of the wafer is covered by nitride.

Figure 9E:
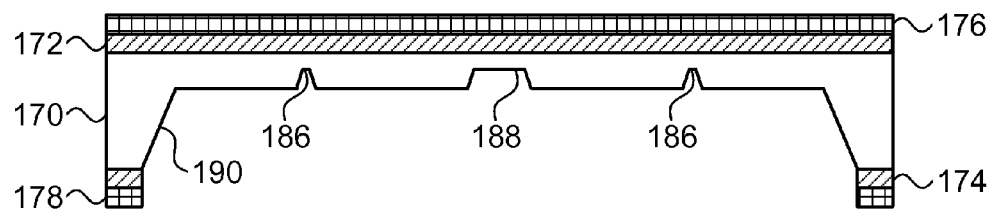

A second wet etching process, using a KOH bath, for example, is then applied in order to thin wafer 170 to a predefined target thickness, typically on the order of 30-150 μm, as shown in FIG. 9E. This step removes the silicon from the exposed side of the wafer, while leaving a sloped supporting edge 190 around the device area. (As noted earlier, the slope is an inherent result of the wet etching process in crystalline silicon.) Because of the crystal-plane-specific properties of the wet etching process, however, the etched pattern of features 186, 188 is preserved while the wafer is thinned. If necessary, features 186, 188 can be protected to preserve their shapes while etching the cavity. For example, this sort of protection can be effected using the technique described by P. Pal et al., in "A novel process for perfect convex corner realization in bulk micromachining," *J. Micromech. Microeng.* 14 (2004), pages 1416-1420, which is incorporated herein by reference.

Figure 9F:
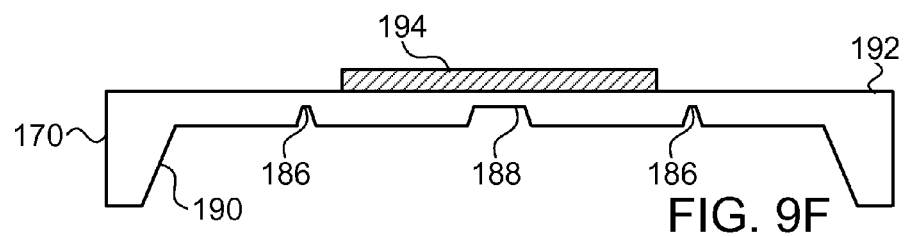

After wafer 170 has been patterned and thinned, the remaining dielectric sub-layers 172, 176, 174 and 178 are removed from the wafer, by suitable stripping processes. A reflective layer 194 may be deposited on the unpatterned side of wafer 170 that is now exposed, as shown in FIG. 9F.

Figure 9G:
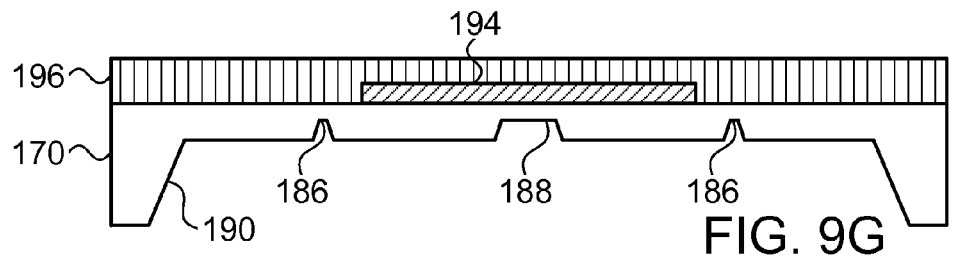
Figure 9H:
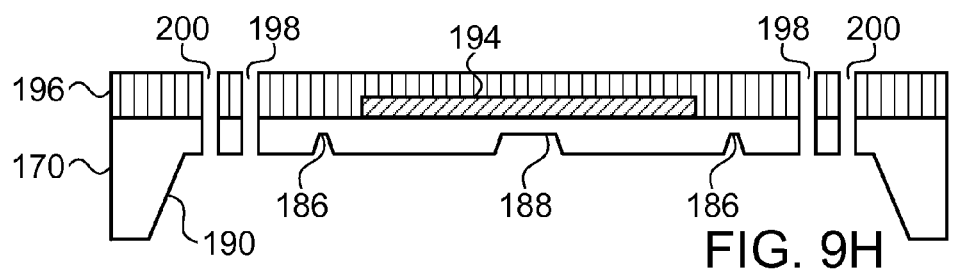

In order to release the device, a photoresist layer 196 is deposited over the unpatterned side of wafer 170, as shown in FIG. 9G. A photolithographic process is then applied to the photoresist in order to define the locations of the through features and remove the photoresist from these locations. A dry etching process, such as RIE and/or DRIE, is then applied to etch the through features, including (in this example) hinge openings 198 and release openings 200, as illustrated in FIG. 9H. These openings extend through thinned wafer 170 around the pattern of features 186, 188 that was previously etched into the other side of the wafer.

Figure 9I:
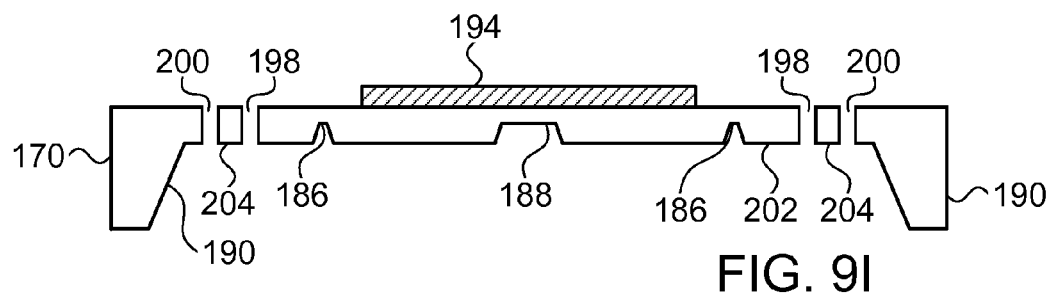
Figure 9J:
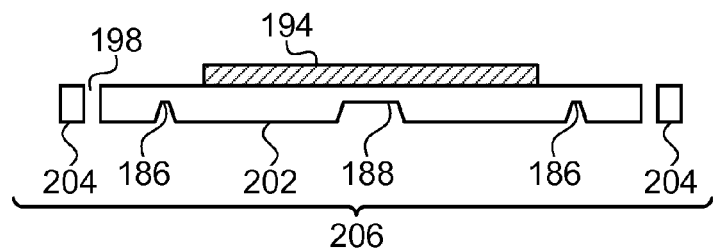

Photoresist layer 196 is now removed, as shown in FIG. 9I. A device 206 can then be separated from the remaining portion of wafer 170 (i.e., from supporting edge 190) along singulation openings 200, as shown in FIG. 9J. Typically, tabs are left across openings 200 during the etching stage, as shown in FIG. 13, and these tabs are broken in order to singulate the device as explained above. As in the preceding embodiment, device 206 in this example comprises a micromirror 202, which is coated by reflective layer 194 and is attached by hinges extending across release openings 198 to a base 204.

FIGS. 10A-10E are schematic, sectional illustrations showing successive stages in production of a micro-mechanical device, in accordance with still another embodiment of the present invention. This embodiment is similar to the embodiment of FIGS. 9A-9J, except that in the present embodiment, in the thinning stage, the silicon is removed simultaneously from both sides of wafer 170 by the wet etching process. This approach may be advantageous in producing MEMS devices with a balanced center of mass.

Figure 10A:
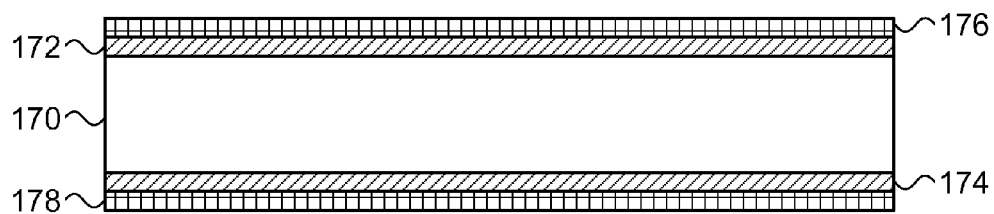
FIGS. 10A-10E are schematic, sectional illustrations showing successive stages in production of a micro-mechanical device, in accordance with still another embodiment of the present invention.
Figure 10B:
Figure 10C:
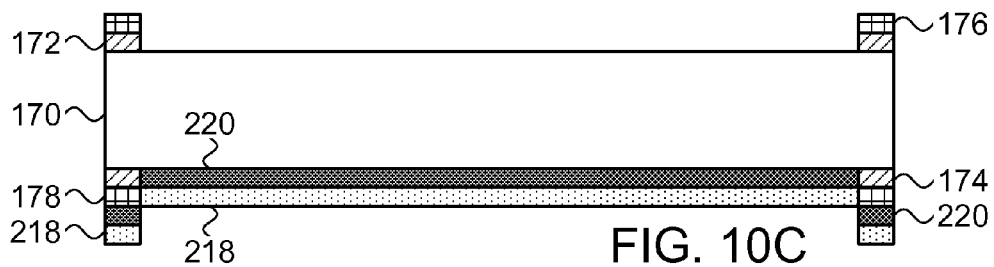

As shown in FIG. 10A, the two sides of wafer 170 are coated with dielectric layers by successive deposition of SiO2 sub-layers 172, 174 and Si3N4 sub-layers 176, 178. In this case, however, sub-layers 172 and 176 are etched away from an area 210 of wafer 170, while sub-layers 174 and 178 are etched away from an area 212 of the wafer, thus exposing the silicon surface on both sides of the wafer, as shown in FIG. 10B. RIE and Buffered oxide etching (BOE) may be used to achieve this result. One side of wafer 170 (the lower side in these figures) is then re-coated with an additional SiO2 sub-layer 220 and Si3N4 sub-layer 218, as shown in FIG. 10C. As noted earlier, Si3N4 layers can be used alone, without the underlying SiO2 layers, as long as sufficient care is taken to preserve the silicon surface as the Si3N4 is etched off.

Figure 10D:
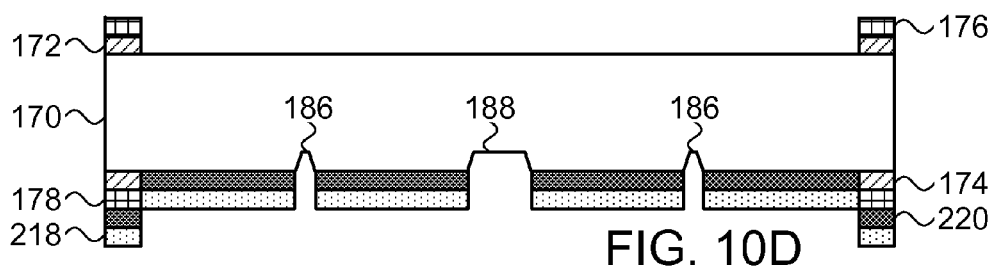
Figure 10E:
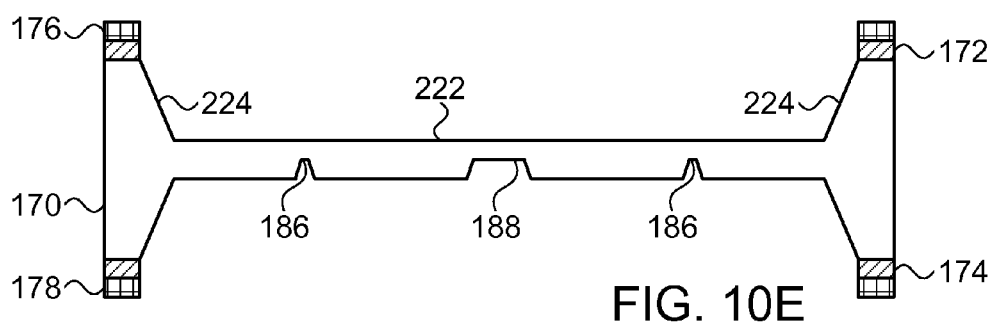

Using a dry etching process, such as RIE (for layer 218), followed by a BOE (for layer 220), a pattern of features 186, 188 of the target device is etched through sub-layers 218 and 220 into area 212 of wafer 170 that was previously exposed, as illustrated in FIG. 10D. After etching the pattern, sub-layers 218 and 220 are removed from areas 210 and 212, again using RIE for Si3N4 layers, followed by BOE for SiO2 layers. A wet etching process, using a KOH bath, for example, is then applied in order to evenly thin wafer 170 from both sides to a predefined target thickness, typically on the order of 30-150 μm, as shown in FIG. 10E. The remaining process steps then proceed as in the previous embodiment.

Fabrication System

Figure 11:
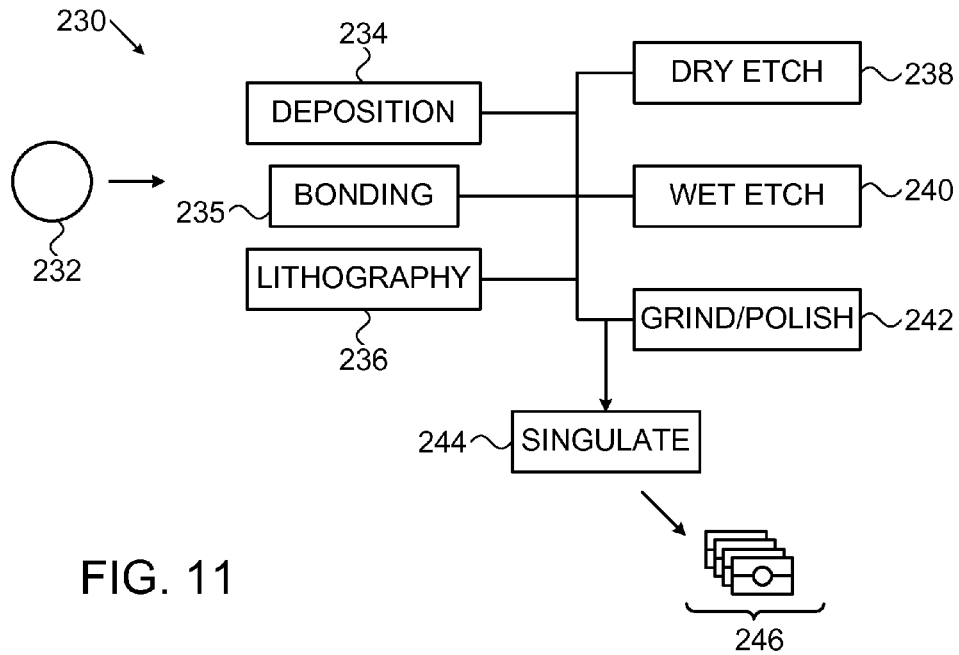
FIG. 11 is a block diagram that schematically illustrates a system for production of MEMS devices in accordance with an embodiment of the present invention.

FIG. 11 is a block diagram that schematically illustrates a system 230 for production of MEMS devices 246 in accordance with an embodiment of the present invention. System 230 accepts semiconductor wafers 232 as input material and outputs devices 246 as singulated silicon dies. These dies may then be assembled, together with electronic, magnetic and optical components, for example, into finished products.

The elements of system 230 are generally standard items of fabrication equipment, which are adapted and configured to carry out the methods described above. One or more deposition stations 234 deposit layers of metal, dielectric materials, and photoresist on wafer 232 as required. A bonding station 235 may be used to bond device wafers to support wafers or other support substrates (and may also serve as a debonding station, although debonding functions may alternatively be performed in a different station). A photolithography station 236 is used to apply patterns to layers on the wafer surface, following which the patterns are etched into the wafer, and parts of the wafer may be thinned. As explained above, some etching steps may be performed by one or more dry etching stations 238, while others are carried out by a wet etching station 240. Alternatively or additionally, grinding and/or polishing machines 242 may be used to thin the wafer.

After completion of the wafer-scale fabrication operations outlined above, devices 246 are separated from the remaining part of wafer 232 and from one another by a singulation station 244. This station may grasp and lift each die away from the wafer and its support structure. The devices separate along singulation openings, as explained above, possibly by breaking thin tabs that extend across the openings until this stage.

As noted earlier, although the above embodiments are described, for the sake of clarity and convenience, with reference to production of certain types of MEMS-based scanning mirrors, the principles of the present invention are also applicable, mutatis mutandis, to other types of micromechanical devices. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for fabrication of a device from a wafer of semiconductor material having first and second sides, the method comprising:
   depositing a dielectric layer on at least the first side of the wafer;
   etching, using a first etching process, a pattern of features of the device through the dielectric layer into the semiconductor material on the first side of the wafer;
   after etching the pattern, removing the dielectric layer to expose the semiconductor material over at least an area of the wafer that contains the pattern;
   after removing the dielectric layer, locally thinning the entire exposed area of the wafer that contains the pattern and from which the dielectric layer was removed to a predefined thickness by removing the semiconductor material from at least the first side of the wafer using a second, wet etching process, while preserving the pattern in the area, wherein removing the dielectric layer comprises leaving the dielectric layer in place only around a perimeter of the device thereby preventing thinning of the perimeter during the wet etching process; and
   etching through the thinned wafer in the area of the device so as to release a moving part of the device.

2. A method for fabrication of a device from a wafer of semiconductor material having first and second sides, the method comprising:
   depositing a dielectric layer on at least the first side of the wafer;
   etching, using a dry etching process, a pattern of features of the device through the dielectric layer into the semiconductor material on the first side of the wafer;
   after etching the pattern, removing the dielectric layer from to expose the semiconductor material over at least the area of the device;
   after etching the pattern, locally thinning the entire exposed area of the wafer in an area of the device that contains the pattern and from which the dielectric layer was removed to a predefined thickness by removing the semiconductor material from at least the first side of the wafer using a wet etching process, while preserving the pattern in the area, wherein removing the dielectric layer comprises leaving the dielectric layer in place only around a perimeter of the device thereby preventing thinning of the perimeter during the wet etching process; and
   etching through the thinned wafer in the area of the device so as to release a moving part of the device,
   wherein depositing the dielectric layer comprises depositing first and second dielectric layers, respectively, on the first and second sides of the wafer, wherein the first dielectric layer is removed from the wafer before thinning the wafer, and the second dielectric layer is removed from the wafer only after thinning the wafer.

3. A method for fabrication of a device from a wafer of semiconductor material having first and second sides, the method comprising:
   etching, using a dry etching process, a pattern of features of the device into the semiconductor material on the first side of the wafer,
   wherein etching the pattern comprises:
      depositing a first dielectric layer on at least the first side of the wafer;
      etching away the first dielectric layer from the area of the wafer that is to contain the pattern, so as to expose the semiconductor material in the area while the first dielectric layer remains in place around a perimeter of the device;
      depositing a second dielectric layer over the exposed semiconductor material and over the remaining first dielectric material;
      etching the pattern of features of the device into the semiconductor material through the second dielectric layer; and
      after etching the pattern, removing the second dielectric layer to expose the semiconductor material over at least the area of the device, while leaving the first dielectric layer in place around the perimeter of the device so as to prevent thinning of the perimeter during a wet etching process;
   after etching the pattern, locally thinning the entire exposed area of the wafer in an area of the device that contains the pattern and from which the dielectric layer was removed to a predefined thickness by removing the semiconductor material from at least the first side of the wafer using the wet etching process, while preserving the pattern in the area; and
   etching through the thinned wafer in the area of the device so as to release a moving part of the device.

4. The method according to claim 1, wherein the semiconductor material is silicon, and wherein the dielectric layer comprises a first sub-layer of silicon dioxide and a second sub-layer of silicon nitride adjacent to the first sub-layer.

5. The method according to claim 1, wherein thinning the wafer comprises removing the semiconductor material from both the first and second sides of the wafer using the wet etching process.

6. The method according to claim 1, and comprising depositing a reflective layer on the second side of the wafer after thinning the wafer, whereby the device is configured to serve as a scanning mirror.

7. The method according to claim 1, wherein etching through the thinned wafer comprises depositing a photoresist on the second side of the wafer, and applying a photolithographic process to define and etch openings passing through the thinned wafer.

8. The method according to claim 7, wherein the openings comprise release openings, whereby the moving part of the device is separated along the release openings from a remaining portion of the device.

9. The method according to claim 7, wherein the openings comprise singulation openings around an area of the device, and wherein the method comprises separating the device from a remaining portion of the wafer along the singulation openings.

10. The method according to claim 9, wherein applying the photolithographic process comprises etching the singulation openings so as to leave tabs extending across the singulation openings between the device and the remaining portion of the wafer, and wherein separating the device comprises breaking the tabs.

11. The method according to claim 1, wherein the first etching process is a dry etching process.

\* \* \* \* \*